(12) United States Patent
Lin et al.

(10) Patent No.: US 10,685,922 B2
(45) Date of Patent: Jun. 16, 2020

(54) PACKAGE STRUCTURE WITH STRUCTURE REINFORCING ELEMENT AND MANUFACTURING METHOD THEREOF

(71) Applicant: Unimicron Technology Corp., Taoyuan (TW)

(72) Inventors: Pu-Ju Lin, Hsinchu (TW); Cheng-Ta Ko, Taoyuan (TW); Yu-Hua Chen, Hsinchu (TW); Tzyy-Jang Tseng, Taoyuan (TW); Ra-Min Tain, Hsinchu County (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 16/240,806

(22) Filed: Jan. 7, 2019

(65) Prior Publication Data

US 2019/0139907 A1    May 9, 2019

Related U.S. Application Data

(63) Continuation-in-part of application No. 15/590,020, filed on May 9, 2017, now Pat. No. 10,178,755.

(30) Foreign Application Priority Data

Dec. 11, 2018    (TW) .............................. 107144592 A

(51) Int. Cl.
*H01L 23/16* (2006.01)
*H01L 23/66* (2006.01)
(Continued)

(52) U.S. Cl.
CPC ............ *H01L 23/562* (2013.01); *H01L 23/16* (2013.01); *H01L 23/66* (2013.01); *H01L 24/09* (2013.01);
(Continued)

(58) Field of Classification Search
CPC ....... H01L 23/562; H01L 23/66; H01L 24/09; H01L 2223/6677; H01L 2224/02331;
(Continued)

(56) References Cited

U.S. PATENT DOCUMENTS 6,740,985 B1    5/2004   Zhao
7,182,648 B2    2/2007   Han et al.
(Continued)

FOREIGN PATENT DOCUMENTS

CN          101049056 B        6/2011
JP          2016029697 A       3/2016
(Continued)

OTHER PUBLICATIONS

Jonas Zürcher et al., "Nanoparticle assembly and sintering towards all-copper flip chip interconnects", 2015 IEEE Electronic Components and Technology Conference (ECTC), pp. 1115-1121.
(Continued)

*Primary Examiner* — Timothy J Thompson
*Assistant Examiner* — Michael F McAllister
(74) *Attorney, Agent, or Firm* — CKC & Partners Co., LLC

(57) ABSTRACT

A package structure includes a redistribution structure, a chip, one or more structural reinforcing elements, and a protective layer. The redistribution structure includes a first circuit layer and a second circuit layer disposed over the first circuit layer. The first circuit layer is electrically connected to the second circuit layer. The chip is disposed over the redistribution structure and electrically connected to the second circuit layer. The one or more structural reinforcing elements are disposed over the redistribution structure. The structural reinforcing element has a Young's modulus in a range of of 30 to 200 GPa. The protective layer overlays the chip and a sidewall of the structural reinforcing element.

8 Claims, 24 Drawing Sheets

(51) Int. Cl.
*H01L 23/00* (2006.01)
*H01L 23/31* (2006.01)

(52) U.S. Cl.
CPC .. *H01L 23/3128* (2013.01); *H01L 2223/6677* (2013.01); *H01L 2224/0239* (2013.01); *H01L 2224/02331* (2013.01); *H01L 2224/02371* (2013.01); *H01L 2924/3511* (2013.01)

(58) Field of Classification Search
CPC ... H01L 2224/02371; H01L 2224/0239; H01L 2924/3511
USPC .......................................................... 174/260
See application file for complete search history.

(56) References Cited

U.S. PATENT DOCUMENTS

| | | | |
|---|---|---|---|
| 8,021,921 B2 | 9/2011 | Lin et al. | |
| 8,193,624 B1* | 6/2012 | Sohn | H01L 21/563 |
| | | | 257/684 |
| 8,421,225 B2 | 4/2013 | Ramanathan et al. | |
| 8,492,893 B1 | 7/2013 | Sohn et al. | |
| 8,791,562 B2* | 7/2014 | Lee | H01L 25/0655 |
| | | | 257/612 |
| 9,117,825 B2 | 8/2015 | Liu et al. | |
| 9,192,045 B2 | 11/2015 | Osaki | |
| 9,355,977 B2 | 5/2016 | Lin et al. | |
| 9,462,690 B1 | 10/2016 | Darveaux et al. | |
| 9,472,520 B2 | 10/2016 | Jadhav et al. | |
| 9,576,929 B1 | 2/2017 | Shao et al. | |
| 9,679,806 B1 | 6/2017 | Arvin et al. | |
| 9,844,134 B2 | 12/2017 | Mischitz et al. | |
| 9,875,957 B2 | 1/2018 | Shimizu et al. | |
| 9,876,042 B2 | 1/2018 | Yoo et al. | |
| 9,899,238 B2* | 2/2018 | Karhade | H01L 21/563 |
| 9,978,710 B2 | 5/2018 | Dubey et al. | |
| 2007/0256858 A1 | 11/2007 | Kariya et al. | |
| 2009/0273073 A1* | 11/2009 | Tachibana | H01L 21/563 |
| | | | 257/692 |
| 2011/0198114 A1 | 8/2011 | Maeda et al. | |
| 2012/0018871 A1* | 1/2012 | Lee | H01L 25/0655 |
| | | | 257/698 |
| 2012/0119359 A1 | 5/2012 | Im et al. | |
| 2012/0186867 A1 | 7/2012 | Asai et al. | |
| 2013/0049229 A1* | 2/2013 | Su | H01L 21/54 |
| | | | 257/777 |
| 2013/0127054 A1* | 5/2013 | Muthukumar | H01L 23/3121 |
| | | | 257/738 |
| 2013/0140074 A1 | 6/2013 | Yang et al. | |
| 2014/0217062 A1 | 8/2014 | Kunstmann et al. | |
| 2014/0242374 A1 | 8/2014 | Strasser et al. | |
| 2015/0364436 A1 | 12/2015 | Yu et al. | |
| 2016/0351529 A1 | 12/2016 | Brunschwiler et al. | |
| 2017/0047302 A1 | 2/2017 | Morita et al. | |
| 2017/0194278 A1 | 7/2017 | Shao et al. | |
| 2017/0287871 A1* | 10/2017 | Lu | H01L 23/24 |
| 2018/0082933 A1* | 3/2018 | Ko | H01L 23/16 |
| 2018/0332700 A1 | 11/2018 | Tain et al. | |
| 2019/0043819 A1* | 2/2019 | Ho | H01L 21/6835 |
| 2019/0043847 A1* | 2/2019 | Lee | H01L 23/427 |
| 2019/0189561 A1* | 6/2019 | Rusli | H01L 21/568 |

FOREIGN PATENT DOCUMENTS

| | | |
|---|---|---|
| TW | 545098 B | 8/2003 |
| TW | I252719 B | 4/2006 |
| TW | 200807661 A | 2/2008 |
| TW | I611546 B | 1/2018 |
| TW | I620303 B | 4/2018 |
| TW | I628775 B | 7/2018 |

OTHER PUBLICATIONS

Jonas Zurcher et al., "All-Copper Flip Chip Interconnects by Pressureless and Low Temperature Nanoparticle Sintering" 2016 IEEE 66th Electronic Components and Technology Conference (ECTC), May 31, 2016~Jun. 3, 2016, Las Vegas, NV,USA.

* cited by examiner

PACKAGE STRUCTURE WITH STRUCTURE REINFORCING ELEMENT AND MANUFACTURING METHOD THEREOF

CROSS-REFERENCE TO RELATED APPLICATION

This application is a Continuation-in-part of U.S. application Ser. No. 15/590,020, filed on May 9, 2017, which issued as U.S. patent Ser. No. 10/178,755 on Jan. 8, 2019. This application further claims priority to Taiwan Application Serial Number 107144592, filed Dec. 11, 2018, which is herein incorporated by reference.

BACKGROUND

Field of Invention

The present disclosure relates to a package structure, and to a method of manufacturing a package structure.

Description of Related Art

Traditionally, a chip package structure includes a substrate, a chip over the substrate, and a package material layer overlying the chip. Since there are large differences in coefficients of thermal expansion of the substrate, chip, and package material layer, the chip package structure is often severely warped when forming the chip and the package material layer over the substrate using a thermal process. Therefore, a yield of the chip package structure mounted on a printed circuit board is reduced.

On the other hand, when a package structure is formed on another package structure to form a package-on-package (POP), the warpage phenomenon also causes difficulty in this process.

SUMMARY

A first embodiment of the present disclosure is to provide a package structure, which includes a redistribution structure, a chip, one or more structural reinforcing elements, and a protective layer. The redistribution structure includes a first circuit layer and a second circuit layer disposed over the first circuit layer. The first circuit layer is electrically connected to the second circuit layer. The chip is disposed over the redistribution structure and electrically connected to the second circuit layer. The one or more structural reinforcing elements are disposed over the redistribution structure. The structural reinforcing element has a Young's modulus in a range of 30 to 200 GPa. The protective layer overlays the chip and a sidewall of the structural reinforcing element.

According to the first embodiment of the present disclosure, the package structure includes one structural reinforcing element, and the structural reinforcing element surrounds the chip.

According to the first embodiment of the present disclosure, the package structure includes a plurality of structural reinforcing elements, and one of the structural reinforcing elements is disposed at a first side of the chip, and another of the structural reinforcing elements is disposed at a second side of the chip, and the second side is opposite or adjacent to the first side.

According to the first embodiment of the present disclosure, the structural reinforcing element and the chip are separated by a horizontal distance in a range of 50 to 1000 µm.

According to the first embodiment of the present disclosure, a material of the structural reinforcing element includes, but not limited to, bismaleimide-triazine resin, epoxy resin, tin paste or copper paste.

According to the first embodiment of the present disclosure, an upper surface of the structural reinforcing element and an upper surface of the protective layer are coplanar.

A second embodiment of the present disclosure is to provide a package structure, which includes a redistribution structure, a chip, an inner conductive reinforcing element, a first protective layer and an electronic component. The redistribution structure includes a first circuit layer and a second circuit layer disposed over the first circuit layer. The first circuit layer is electrically connected to the second circuit layer. The chip is disposed over the redistribution structure and electrically connected to the second circuit layer. The inner conductive reinforcing element is disposed over the redistribution structure. The inner conductive reinforcing element includes a reinforcing layer and a conductive connector. The reinforcing layer has a Young's modulus in a range of 30 to 200 GPa, and the reinforcing layer has a through hole. The conductive connector is disposed in the through hole. A top portion of the conductive connector and a bottom portion thereof are exposed outside the reinforcing layer, and the bottom portion of the conductive connector is electrically connected to the second circuit layer. The first protective layer overlays the chip and a sidewall of the inner conductive reinforcing element. The electronic component is disposed over the first protective layer and electrically connected to the top portion of the conductive connector.

According to the second embodiment of the present disclosure, the package structure further includes a substrate structure and a second protective layer. The substrate structure is disposed between the first protective layer and the electronic component, and the electronic component is electrically connected to the top portion of the conductive connector through the substrate structure. The second protective layer overlays the electronic component.

According to the second embodiment of the present disclosure, the inner conductive reinforcing element surrounds the chip.

According to the second embodiment of the present disclosure, the inner conductive reinforcing element and the chip are separated by a horizontal distance in a range of 50 to 1000 µm.

According to the second embodiment of the present disclosure, a material of the reinforcing layer includes bismaleimide-triazine resin, epoxy resin, glass or ceramic.

According to the second embodiment of the present disclosure, an upper surface of the inner conductive reinforcing element and an upper surface of the first protective layer are coplanar.

A third embodiment of the present disclosure is to provide a package structure, which includes a redistribution structure, a chip, an inner conductive reinforcing element, a protective layer and an antenna pattern. The redistribution structure includes a first circuit layer and a second circuit layer disposed over the first circuit layer. The first circuit layer is electrically connected to the second circuit layer. The chip is disposed over the redistribution structure and electrically connected to the second circuit layer. The inner conductive reinforcing element is disposed over the redistribution structure. The inner conductive reinforcing element includes a reinforcing layer and a conductive connector. The reinforcing layer has a Young's modulus in a range of 30 to 200 GPa, and the reinforcing layer has a through hole. The conductive connector is disposed in the through hole. A top portion of the conductive connector and a bottom portion thereof are exposed outside the reinforcing layer, and the bottom portion of the conductive connector is electrically connected to the second circuit layer. The protective layer overlays the chip and a sidewall of the inner conductive reinforcing element. The antenna pattern is disposed over the protective layer and electrically connected to the top portion of the conductive connector.

According to the third embodiment of the present disclosure, the inner conductive reinforcing element surrounds the chip.

According to the third embodiment of the present disclosure, the inner conductive reinforcing element and the chip are separated by a horizontal distance in a range of 50 to 1000 µm.

According to the third embodiment of the present disclosure, the reinforcing layer includes bismaleimide-triazine resin, glass or ceramic.

According to the third embodiment of the present disclosure, an upper surface of the inner conductive reinforcing element and an upper surface of the protective layer are coplanar.

A fourth embodiment of the present disclosure is to provide a method of manufacturing a package structure. The method includes: (i) providing a redistribution structure, in which the redistribution structure includes a first circuit layer and a second circuit layer disposed over the first circuit layer, and the first circuit layer is electrically connected to the second circuit layer; (ii) forming one or more structural reinforcing elements over the redistribution structure, in which the structural reinforcing element has a Young's modulus in a range of 30 to 200 GPa; (iii) disposing a chip over the redistribution structure, in which the chip is electrically connected to the second circuit layer; and (iv) forming a protective layer overlying the chip and the structural reinforcing element.

According to the fourth embodiment of the present disclosure, after the operation (iv), the method further includes: (v) removing a top portion of the protective layer to expose an upper surface of the structural reinforcing element.

A fifth embodiment of the present disclosure is to provide a method of manufacturing a package structure. The method includes: (i) providing a redistribution structure, in which the redistribution structure includes a first circuit layer and a second circuit layer disposed over the first circuit layer, and the first circuit layer is electrically connected to the second circuit layer; (ii) forming an inner conductive reinforcing element over the redistribution structure, in which the inner conductive reinforcing element includes: a reinforcing layer having a Young's modulus in a range of 30 to 200 GPa, in which the reinforcing layer has a through hole; and a conductive connector disposed in the through hole, in which a top portion of the conductive connector and a bottom portion thereof are exposed outside the reinforcing layer, and the bottom portion of the conductive connector is electrically connected to the second circuit layer; (iii) disposing a chip over the redistribution structure, in which the chip is electrically connected to the second circuit layer; (iv) forming a first protective layer overlying the chip and the inner conductive reinforcing element; and (v) disposing an electronic component over the first protective layer, in which the electronic component is electrically connected to the top portion of the conductive connector.

According to the fifth embodiment of the present disclosure, the operation (ii) includes: (a) providing a substrate, in which the substrate has a Young's modulus in a range of 30 to 200 GPa; (b) performing a drilling process on the substrate to form the reinforcing layer having the through hole; (c) forming the conductive connector in the through hole to form the inner conductive reinforcing element; and (d) disposing the inner conductive reinforcing element over the redistribution structure.

According to the fifth embodiment of the present disclosure, in the operation (v), the electronic component is disposed over a substrate structure and is overlaid by a second protective layer, and the electronic component is electrically connected to the top portion of the conductive connector through the substrate structure.

A sixth embodiment of the present disclosure is to provide a method of manufacturing a package structure. The method includes: (i) providing a redistribution structure, in which the redistribution structure includes a first circuit layer and a second circuit layer disposed over the first circuit layer, and the first circuit layer is electrically connected to the second circuit layer; (ii) forming an inner conductive reinforcing element over the redistribution structure, in which the inner conductive reinforcing element includes: a reinforcing layer having a Young's modulus in a range of 30 to 200 GPa, in which the reinforcing layer has a through hole; and a conductive connector disposed in the through hole, in which a top portion of the conductive connector and a bottom portion thereof are exposed outside the reinforcing layer, and the bottom portion of the conductive connector is electrically connected to the second circuit layer; (iii) disposing a chip over the redistribution structure, in which the chip is electrically connected to the second circuit layer; (iv) forming a protective layer overlying the chip and the inner conductive reinforcing element; and (v) forming an antenna pattern over the protective layer, in which the antenna pattern is electrically connected to the top portion of the conductive connector.

BRIEF DESCRIPTION OF THE DRAWINGS

The disclosure will be better understood from the following detailed description when read in the claims. It should be emphasized that, depending over the standard practice in the industry, the features are not drawn to scale and are for illustrative purposes only. In fact, the size of the feature can be arbitrarily increased or decreased for the purpose of clarity.

DETAILED DESCRIPTION

In order that the present disclosure is described in detail and completeness, implementation aspects and specific embodiments of the present disclosure with illustrative description are presented; but it is not the only form for implementation or use of the specific embodiments. The embodiments disclosed herein may be combined or substituted with each other in an advantageous manner, and other embodiments may be added to an embodiment without further description. In the following description, numerous specific details will be described in detail in order to enable the reader to fully understand the following embodiments. However, the embodiments of the present disclosure may be practiced without these specific details.

Further, spatially relative terms, such as "beneath," "below," "lower," "over," "on," "upper" and the like, may be used herein for ease of description to describe one element or feature's relationship to another element(s) or feature(s) as illustrated in the figures. The true meaning of the spatially relative terms includes other orientations. For example, when the figure is flipped up and down by 180 degrees, the relationship between one component and another component may change from "beneath," "below," "lower," to "over," "on," "upper." In addition, the spatially relative descriptions used herein should be interpreted the same.

Figure 1A:
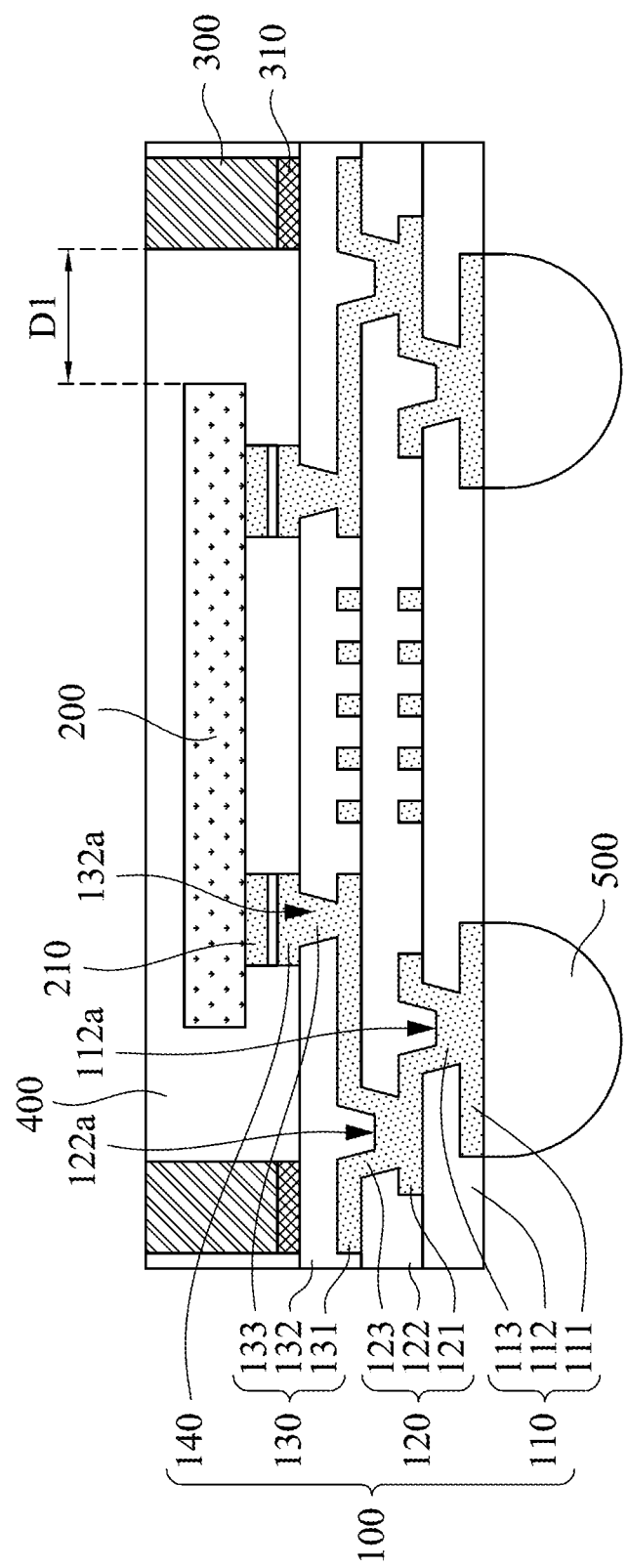
FIG. 1A is a cross-sectional view of a package structure according to a first embodiment of the present disclosure.

Please refer to FIG. 1A. FIG. 1A is a cross-sectional view of a package structure 10 according to a first embodiment of the present disclosure. The package structure 10 includes a redistribution structure 100, a chip 200, one or more structural reinforcing elements 300, a protective layer 400, and solder balls 500.

The redistribution structure 100 includes a first redistribution layer 110, a second redistribution layer 120, a third redistribution layer 130, and a conductive pad 140. Specifically, the first redistribution layer 110 includes a first circuit layer 111, a first insulating layer 112, and a first conductive contact 113. In some embodiments, the first circuit layer 111 and the first conductive contact 113 include any conductive material, such as a metal such as copper, nickel or silver. In some embodiments, the first circuit layer 111 has a line width and a line spacing of less than 8 µm, such as 7 µm, 6 µm, 5 µm, 4 µm, 3 µm, 2 µm, 1 µm, or 0.5 µm. The first insulating layer 112 covers the first circuit layer 111, and the first insulating layer 112 has a via hole 112a. In some embodiments, the first insulating layer 112 includes a photosensitive dielectric material. The via hole 112a exposes a portion of the first circuit layer 111, and the first conductive contact 113 is conformally formed in the via hole 112a, so that the first conductive contact 113 is in contact with the first circuit layer 111.

The second redistribution layer 120 is disposed over the first redistribution layer 110. Specifically, the second redistribution layer 120 includes a second circuit layer 121, a second insulating layer 122, and a second conductive contact 123. The second circuit layer 121 is in contact with the first conductive contact 113 such that the second circuit layer 121 is electrically connected to the first circuit layer 111. In some embodiments, the second circuit layer 121 and the second conductive contact 123 include any conductive material such as a metal such as copper, nickel or silver. In some embodiments, the second circuit layer 121 has a line width and a line spacing of less than 8 µm, such as 7 µm, 6 µm, 5 µm, 4 µm, 3 µm, 2 µm, 1 µm, or 0.5 µm. The second insulating layer 122 covers the second circuit layer 121, and the second insulating layer 122 has a via hole 122a. In some embodiments, the second insulating layer 122 includes a photosensitive dielectric material. The via hole 122a exposes a portion of the second circuit layer 121, and the second conductive contact 123 is conformally formed in the via hole 122a, so that the second conductive contact 123 is in contact with the second circuit layer 121.

The third redistribution layer 130 is disposed over the second redistribution layer 120. Specifically, the third redistribution layer 130 includes a third circuit layer 131, a third insulating layer 132, and a third conductive contact 133. The third circuit layer 131 is in contact with the second conductive contact 123 such that the third circuit layer 131 is electrically connected to the second circuit layer 121. In some embodiments, the third circuit layer 131 and the third conductive contact 133 include any electrically conductive material, such as a metal such as copper, nickel or silver. In some embodiments, the third circuit layer 131 has a line width and a line spacing of less than 8 µm, such as 7 µm, 6 µm, 5 µm, 4 µm, 3 µm, 2 µm, 1 µm, or 0.5 µm. The third insulating layer 132 covers the third circuit layer 131, and the third insulating layer 132 has a via hole 132a. In some embodiments, the third insulating layer 132 includes a photosensitive dielectric material. The via hole 132a exposes a portion of the third circuit layer 131, and the third conductive contact 133 is filled in the via hole 132a, so that the third conductive contact 133 is in contact with the third circuit layer 131.

The conductive pad 140 is in contact with the third conductive contact 133 such that the conductive pad 140 is electrically connected to the third circuit layer 131. In some embodiments, the conductive pad 140 includes any conductive material, such as a metal such as copper, nickel, or silver.

The chip 200 is disposed over the redistribution structure 100 and electrically connected to the third circuit layer 131. Specifically, there are a plurality of metal bumps 210 (e.g., chip pins) disposed on a lower surface of the chip 200, and the metal bumps 210 are bonded to the conductive pads 140 through a solder material, so that the chip 200 is electrically connected to the third circuit layer 131.

The one or more structural reinforcing elements 300 are disposed over the redistribution structure 100. Specifically, the structural reinforcing element 300 is bonded to the third redistribution layer 130 using a bonding material 310. In some embodiments, the bonding material 310 includes silicone adhesive, epoxy resin adhesive, polyimide (PI) adhesive or polyethylene terephthalate (PET) adhesive, but not limited thereto. It should be understood that the structural reinforcing element 300 has a Young's modulus in a range of 30 to 200 GPa, such as 100, 150 or 200 GPa. As mentioned previously, the conventional chip package structures often suffer from severe warpage due to the thermal process. In particular, when a size of the chip package structure reaches a certain range or more, the warpage phenomenon is significantly serious, for example, when a length of the chip package structure is 15 mm or more and a width thereof is 15 mm or more. However, the package structure 10 of the present disclosure is less prone to warpage by the arrangement of the structural reinforcing element 300.

Specifically, the Young's modulus of the structural reinforcing element 300 is in a range of 30 to 200 GPa, thus providing the package structure 10 with a sufficient mechanical strength. Accordingly, even if there is a large difference between coefficients of thermal expansion of materials of elements of the package structure 10, warpage is less likely to occur. In some embodiments, the structural reinforcing element 300 includes, but is not limited to, bismaleimide-tirazine (BT) resin, epoxy, tin paste, or copper paste. Preferably, in some embodiments, the structural reinforcing element 300 and the chip 200 are separated by a horizontal distance D1 in a range of 50 to 1000 μm.

Figure 1B:
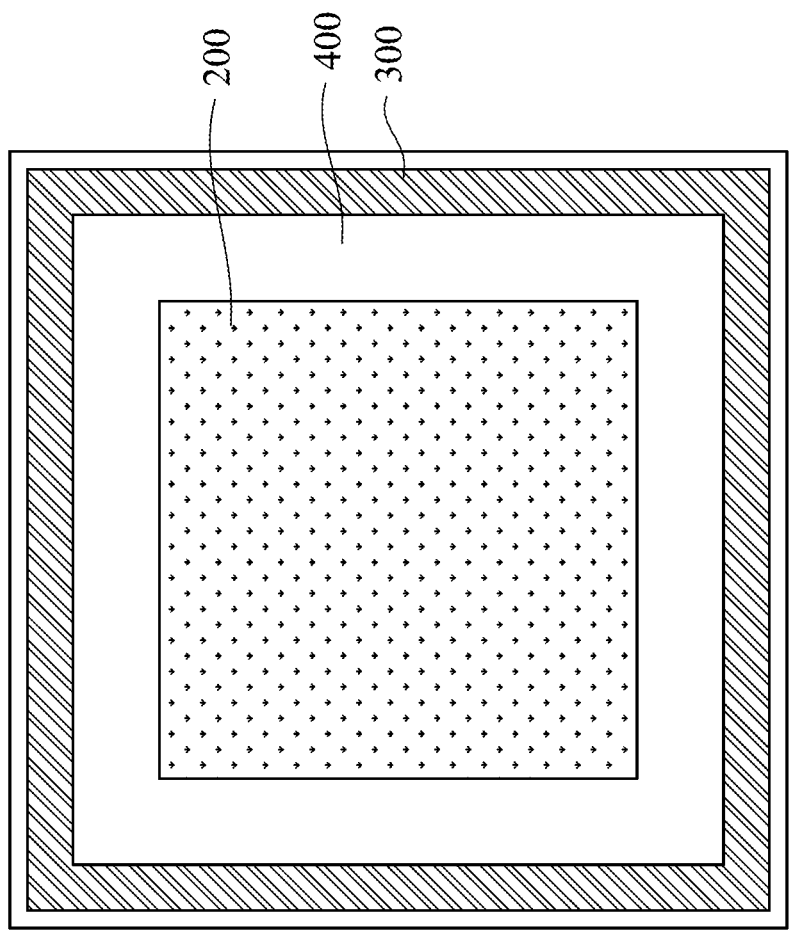
FIG. 1B is a top view of a package structure according to an embodiment of the present disclosure.

For a clearer understanding of the relationship between the chip 200 and the structural reinforcing element 300, please refer to FIG. 1B. FIG. 1B is a top view of a package structure 10 according to an embodiment of the present disclosure. As shown in FIG. 1B, the package structure 10 includes a structural reinforcing element 300, and the structural reinforcing element 300 surrounds the chip 200. Specifically, the structural reinforcing element 300 has a hollow square-shaped contour in top view.

Figure 1C:
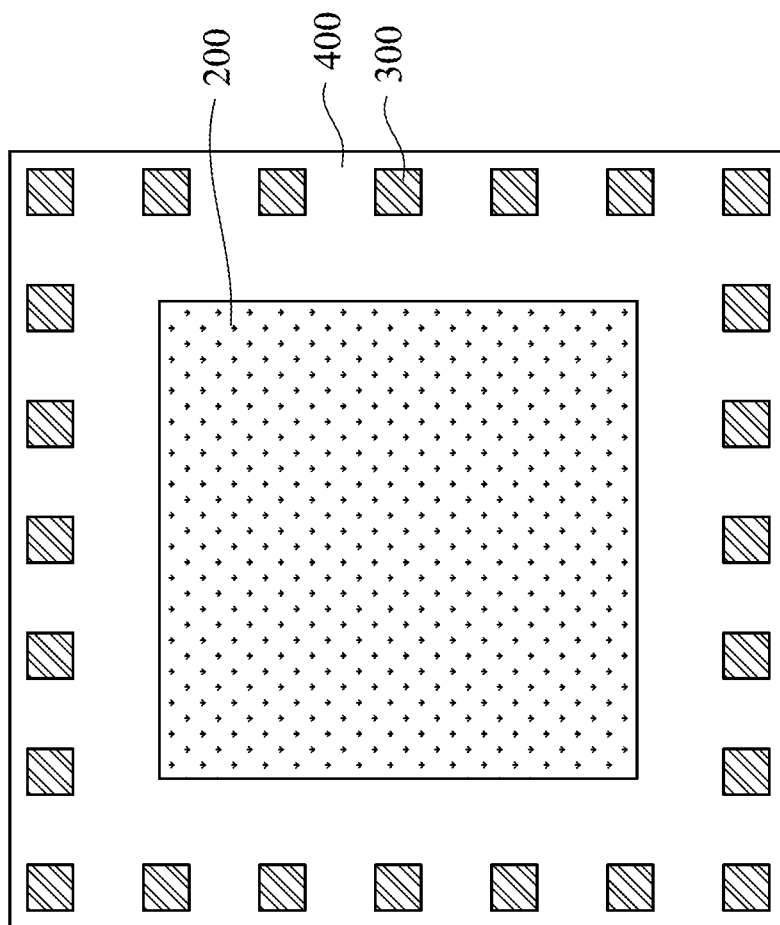
FIG. 1C is a top view of a package structure according to an embodiment of the present disclosure.

In another embodiment, the package structure 10 includes a plurality of structural reinforcing elements 300, as shown in FIG. 1C. FIG. 1C is a top view of a package structure 10 according to an embodiment of the present disclosure. The plurality of structural reinforcing elements 300 are disposed around the chip 200. Specifically, the structural reinforcing elements 300 are disposed on four sides of the chip 200.

Figure 1D:
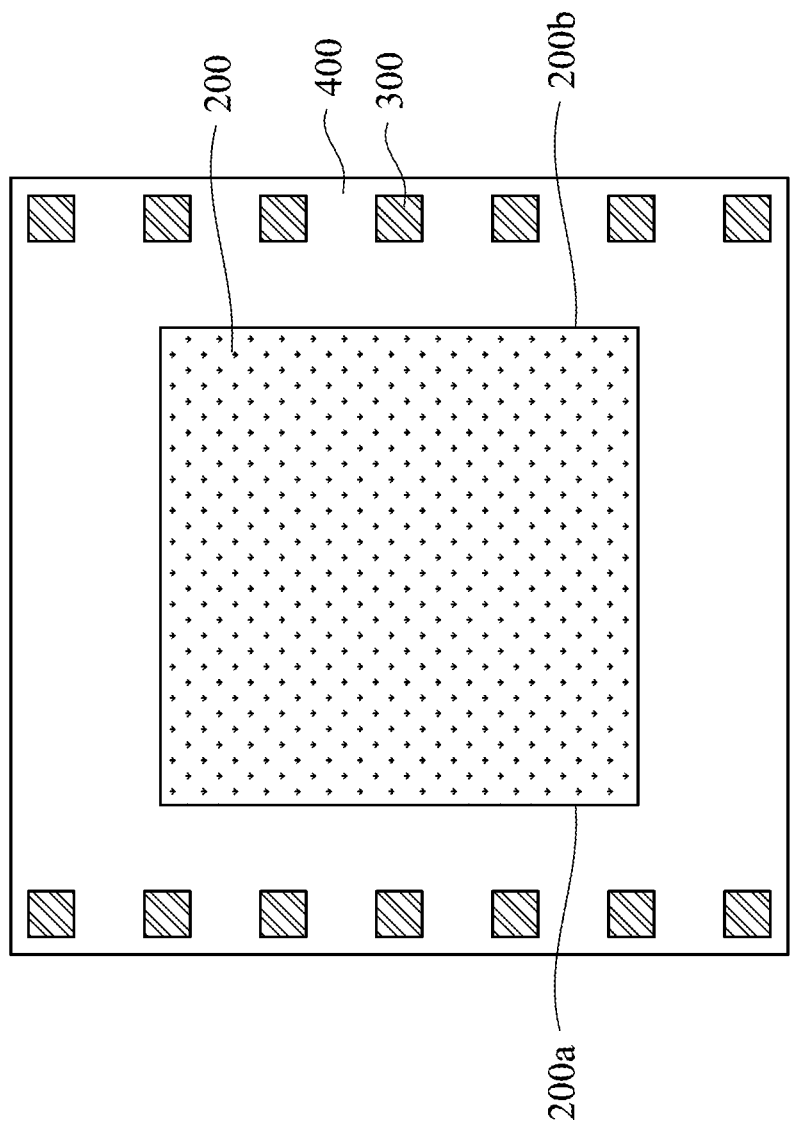
FIG. 1D is a top view of a package structure according to an embodiment of the present disclosure.
Figure 1E:
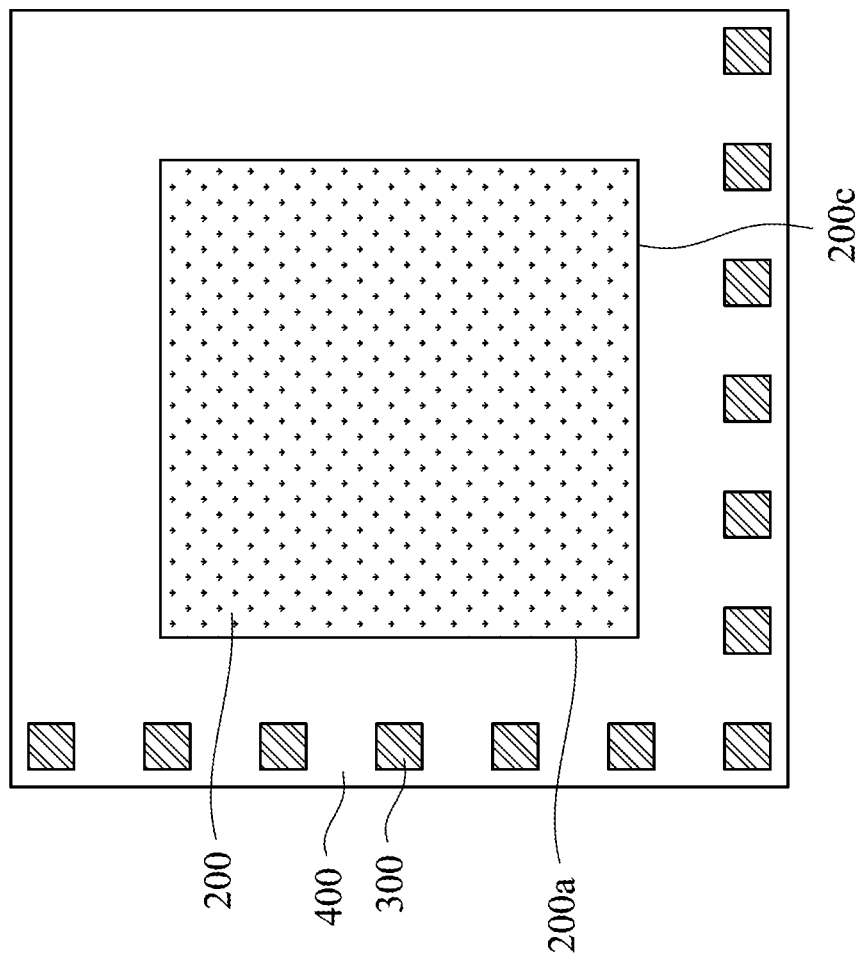
FIG. 1E is a top view of a package structure according to an embodiment of the present disclosure.

Alternatively, a plurality of structural reinforcing elements 300 may be disposed on two sides of the chip 200, please refer to FIGS. 1D and 1E. As shown in FIG. 1D, the plurality of structural reinforcing elements 300 are disposed on a first side 200*a* and a second side 200*b* of the chip 200, and the first side 200*a* is opposite to the second side 200*b*. Alternatively, as shown in FIG. 1E, a plurality of structural reinforcing elements 300 are disposed on a first side 200*a* and a third side 200*c* of the chip 200, and the first side 200*a* is adjacent to the third side 200*c*.

Returning to FIG. 1A, the protective layer 400 overlays the chip 200 and a sidewall of the structural reinforcing element 300 and fills the gap between the chip 200 and the third redistribution layer 130. Specifically, an upper surface of the structural reinforcing element 300 and an upper surface of the protective layer 400 are coplanar. The protective layer 400 can protect the bonding between the metal bumps 210 of the chip 200 and the conductive pads 140, thereby preventing occurrence of peeling. On the other hand, the protective layer 400 can also block moisture and avoid oxidation of the metal bumps 210, the solder material, and the conductive pads 140. In some embodiments, the protective layer 400 includes a resin.

The solder balls 500 are disposed beneath the redistribution structure 100. Specifically, the solder balls 500 are in contact with the first circuit layer 111 such that the solder balls 500 are electrically connected to the first circuit layer 111. In some embodiments, the solder ball 500 includes lead, tin, silver, copper, bismuth, antimony, zinc, or the like, but not limited thereto.

Figure 2:
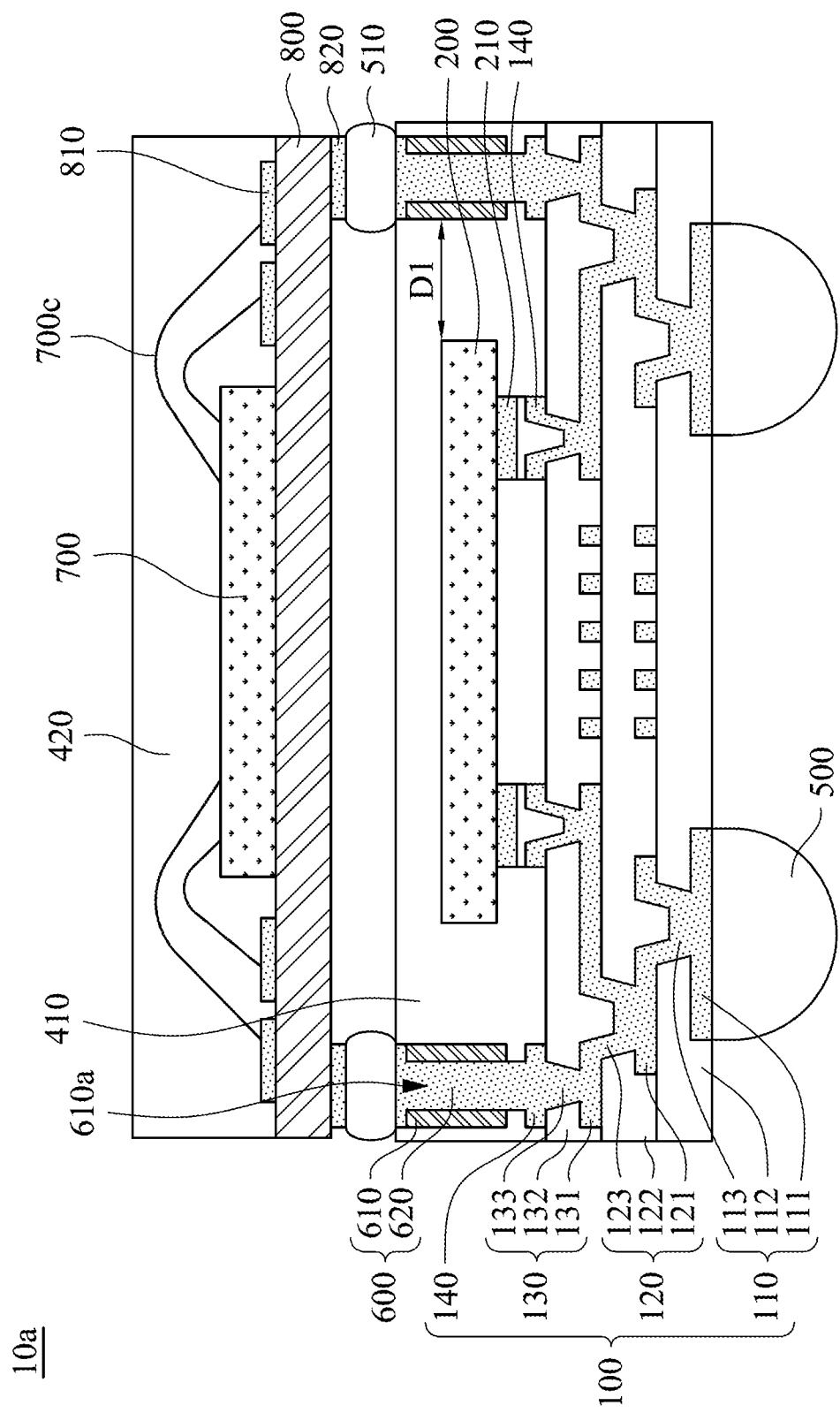
FIG. 2 is a cross-sectional view of a package structure according to a second embodiment of the present disclosure.

Please refer to FIG. 2, which is a cross-sectional view of a package structure 10*a* according to a second embodiment of the present disclosure. The package structure 10*a* includes a redistribution structure 100, a chip 200, an inner conductive reinforcing element 600, a first protective layer 410, an electronic component 700, and a solder ball 500. The details of the redistribution structure 100, the chip 200, and the solder ball 500 are referred to FIG. 1A and the corresponding related paragraphs, and are not described herein.

The inner conductive reinforcing element 600 is disposed over the redistribution structure 100, and the inner conductive reinforcing element 600 includes a reinforcing layer 610 and a conductive connector 620. In some embodiments, the conductive connector 620 includes any electrically conductive material, such as a metal such as copper, nickel, or silver. Specifically, the reinforcing layer 610 has a through hole 610*a*, and the conductive connector 620 is disposed in the through hole 610*a*. More specifically, a top portion of the conductive connector 620 and a bottom portion thereof are exposed outside the reinforcing layer 610, and the bottom portion of the conductive connector 620 is in contact with the conductive pad 140, so that the conductive connector 620 is electrically connected to the third circuit layer 131.

It should be understood that the reinforcing layer 610 has a Young's modulus in a range of 30 to 200 GPa, thus providing the package structure 10*a* with a sufficient mechanical strength. In some embodiments, the reinforcing layer 610 includes, but is not limited to, bismaleimide-triazine resin, epoxy, glass, or ceramic. Preferably, in some embodiments, the inner conductive reinforcing element 600 and the chip 200 are separated by a horizontal distance D1 in a range of 50 to 1000 μm.

The relationship between the chip 200 and the inner conductive reinforcing element 600 may correspond to the relationship between the chip 200 and the structural reinforcing element 300 in FIG. 1B. That is, the inner conductive reinforcing element 600 surrounds the chip 200.

The first protective layer 410 overlays the chip 200 and a sidewall of the inner conductive reinforcing element 600 and fills a gap between the chip 200 and the third redistribution layer 130. Specifically, an upper surface of the inner conductive reinforcing element 600 and an upper surface of the first protective layer 410 are coplanar. The first protective layer 410 can protect the bonding between the metal bumps 210 of the chip 200 and the conductive pads 140, thereby preventing occurrence of peeling. On the other hand, the first protective layer 410 can also block moisture and avoid oxidation of the metal bumps 210, the solder material, and the conductive pads 140. In some embodiments, the first protective layer 410 includes a resin.

The electronic component 700 is disposed over the first protective layer 410 and electrically connected to the top portion of the conductive connector 620. Specifically, the electronic component 700 is disposed over a substrate structure 800 and is overlaid by a second protective layer 420. The substrate structure 800 has a first conductive pad 810, a second conductive pad 820 and an inner circuit, and the inner circuit is electrically connected to the first conductive pad 810 and the second conductive pad 820. As shown in FIG. 2, the electronic component 700 is electrically connected to the first conductive pads 810 through wires 700*c*. In addition, the second conductive pad 820 is electrically connected to the top portion of the conductive connector 620 through the solder material 510. In some embodiments, the solder material 510 includes lead, tin, silver, copper, bismuth, antimony, zinc, or the like, but is not limited thereto.

The second protective layer 420 can block moisture and avoid oxidation of the wires 700*c* and the first conductive pads 810. In some embodiments, the second protective layer 420 includes a resin. In some embodiments, the electronic component 700 is a memory.

Figure 3:
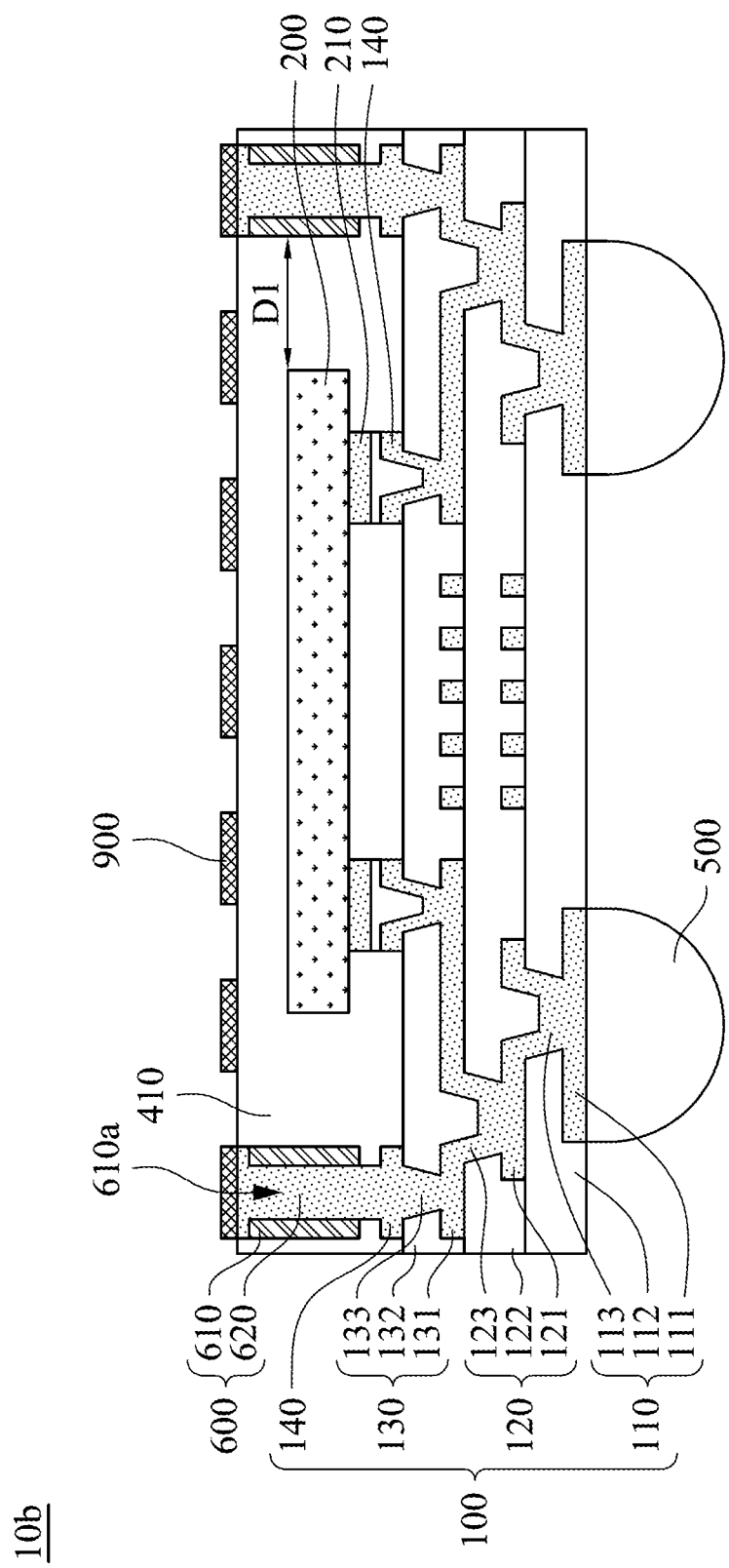
FIG. 3 is a cross-sectional view of a package structure according to a third embodiment of the present disclosure.

Please refer to FIG. 3, which is a cross-sectional view of a package structure 10*b* according to a third embodiment of the present disclosure. It is noted that in the third embodiment, the same or similar elements as those in the second embodiment are given the same reference numerals, and the related description is omitted. The package structure 10*b* of FIG. 3 is similar to the package structure 10*a* of FIG. 2, and the difference therebetween is that the package structure 10b of FIG. 3 does not have the electronic component 700, the substrate structure 800, and the second protective layer 420. Instead, the package structure 10b further includes an antenna pattern 900. The antenna pattern 900 is disposed over the first protective layer 410 and in contact with the top portion of the conductive connector 620 to electrically connect the conductive connector 620.

The present disclosure also provides a method of manufacturing a package structure. FIGS. 4 to 11 are cross-sectional views of various stages of a method of manufacturing a package structure 10 according to the first embodiment of the present disclosure.

Figure 4:
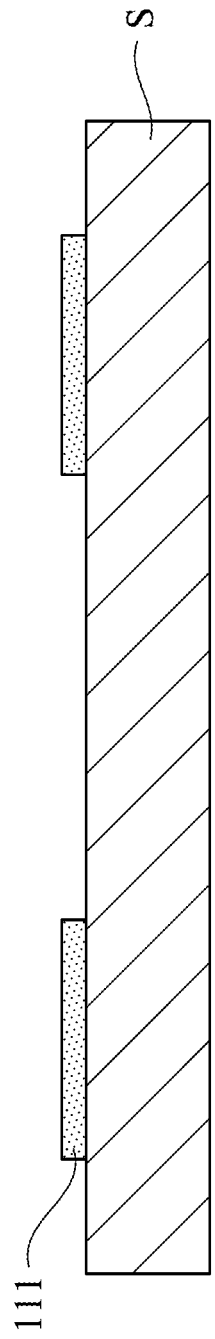
FIGS. 4 to 11 are cross-sectional views of various stages of a method of manufacturing a package structure according to the first embodiment of the present disclosure.

As shown in FIG. 4, a first circuit layer 111 is formed over a substrate S. For example, a conductive material is formed over the substrate S, and the conductive material is patterned to form the first circuit layer 111. In some embodiments, the manner of forming the conductive material includes electroplating, chemical vapor deposition, physical vapor deposition, and the like, but is not limited thereto.

Figure 5:
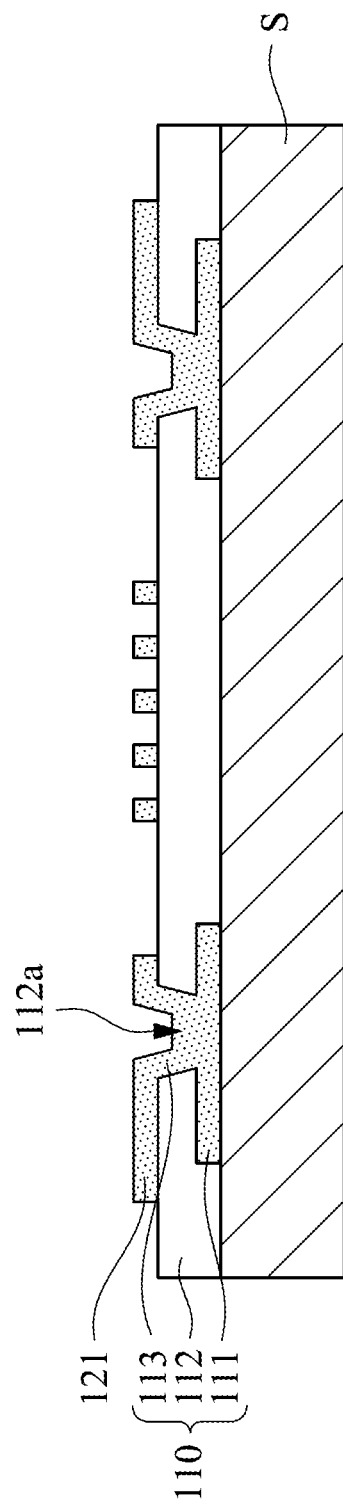

Next, as shown in FIG. 5, a first insulating layer 112 is formed covering the first circuit layer 111, and the first insulating layer 112 includes a via hole 112a exposing a portion of the first circuit layer 111. For example, a dielectric material is formed over the first circuit layer 111, and the dielectric material is patterned to form the via hole 112a. In some embodiments, the manner of forming the dielectric material includes, but is not limited to, chemical vapor deposition, physical vapor deposition, and the like. In some embodiments, a method of patterning the conductive material and the dielectric material includes depositing a photoresist over a layer to be patterned, and performing exposure and development to form a patterned photoresist layer. Next, the patterned photoresist layer is used as an etch mask for etching the layer to be patterned. Finally, the patterned photoresist layer is removed. Alternatively, in embodiments that the dielectric material is a photosensitive dielectric material, a patterning process is accomplished by removing a portion of the photosensitive dielectric material using exposure and development.

Next, a second circuit layer 121 is formed over the first insulating layer 112, and a first conductive contact 113 is conformally formed in the via hole 112a. For example, a conductive material is formed over the first insulating layer 112 and is conformally formed in the via hole 112a. Next, the conductive material is patterned to form the second circuit layer 121 and the first conductive contact 113.

Figure 6:
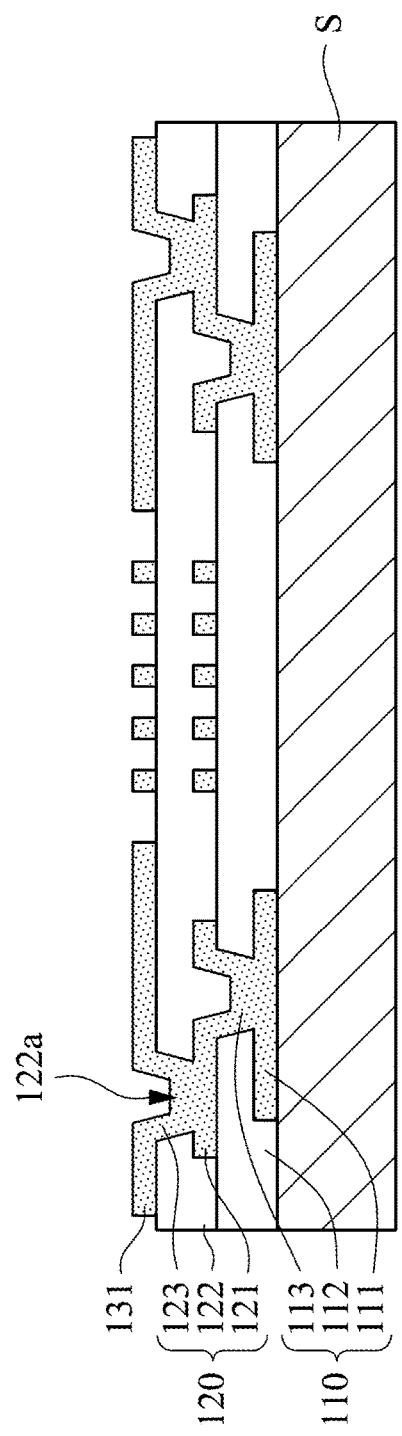

Next, as shown in FIG. 6, a second insulating layer 122 is formed covering the second circuit layer 121, and the second insulating layer 122 includes a via hole 122a exposing a portion of the second circuit layer 121. For example, a dielectric material is formed over the second circuit layer 121, and the dielectric material is patterned to form the via hole 122a.

Next, a third circuit layer 131 is formed over the second insulating layer 122, and a second conductive contact 123 is conformally formed in the via hole 122a. For example, a conductive material is formed over the second insulating layer 122 and is conformally formed in the via hole 122a. Next, the conductive material is patterned to form the third circuit layer 131 and the second conductive contact 123.

Figure 7:
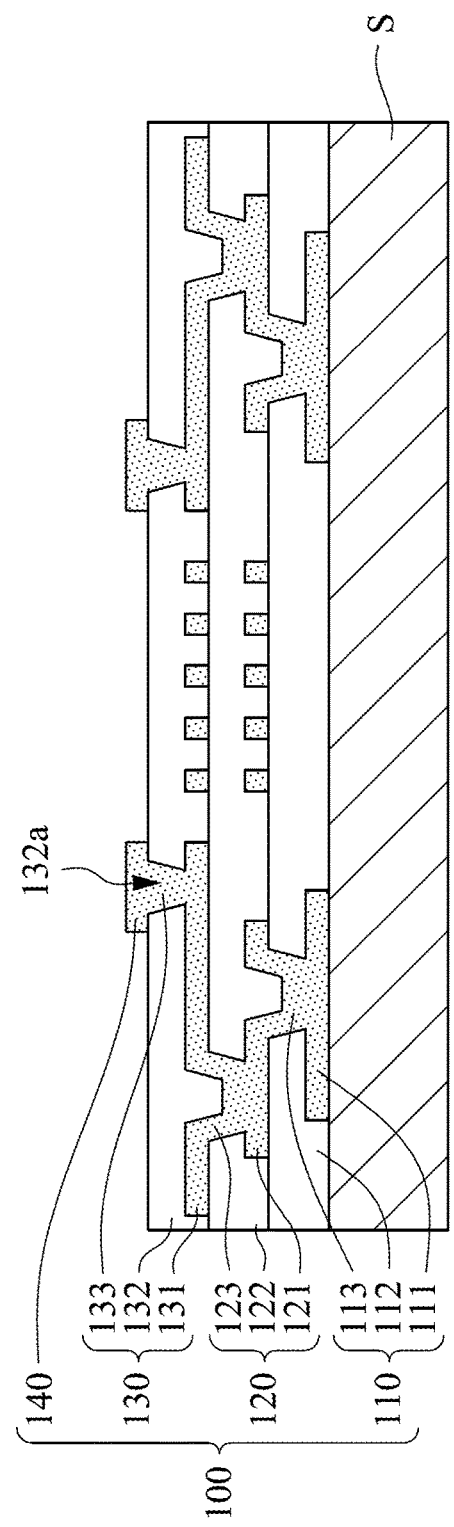

Next, as shown in FIG. 7, a third insulating layer 132 is formed covering the third circuit layer 131, and the third insulating layer 132 includes a via hole 132a exposing a portion of the third circuit layer 131. For example, a dielectric material is formed over the third circuit layer 131, and the dielectric material is patterned to form the via hole 132a.

Next, a conductive pad 140 is formed over the third insulating layer 132, and a third conductive contact 133 is formed in the via hole 132a. For example, a conductive material is formed over the third insulating layer 132 and is formed in the via hole 132a. Next, the conductive material is patterned to form the conductive pad 140 and the third conductive contact 133. Thereby, a redistribution structure 100 is formed over the substrate S.

Figure 8:
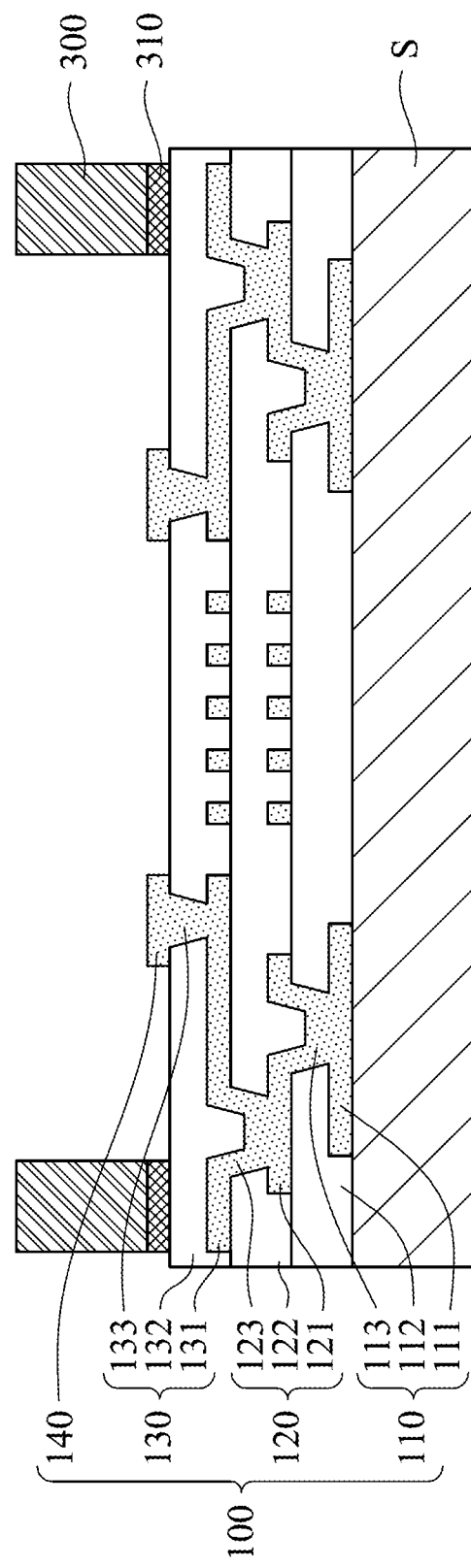

Next, as shown in FIG. 8, one or more structural reinforcing elements 300 are formed over the redistribution structure 100. For example, the structural reinforcing element 300 is attached to the third redistribution layer 130 using a bonding material 310.

Figure 9:
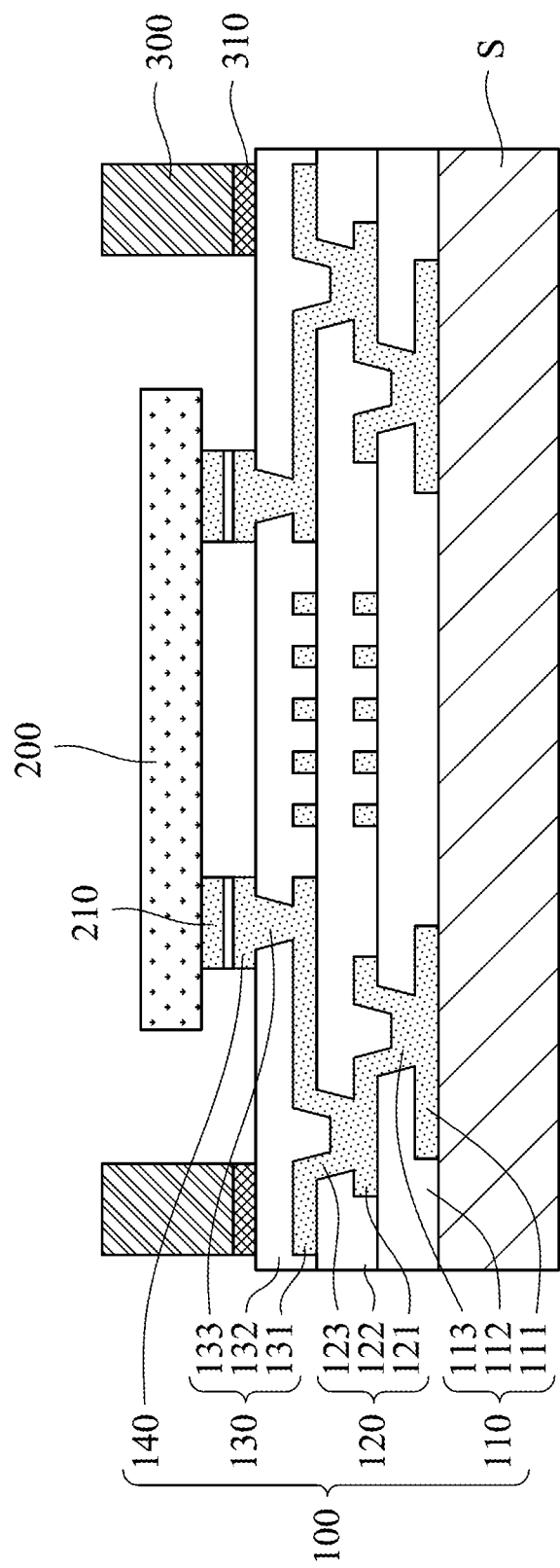

Next, as shown in FIG. 9, a chip 200 is disposed over the redistribution structure 100. For example, a plurality of metal bumps 210 (e.g., chip pins) on a lower surface of the chip 200 are bonded to the conductive pads 140 using a solder material.

Figure 10:
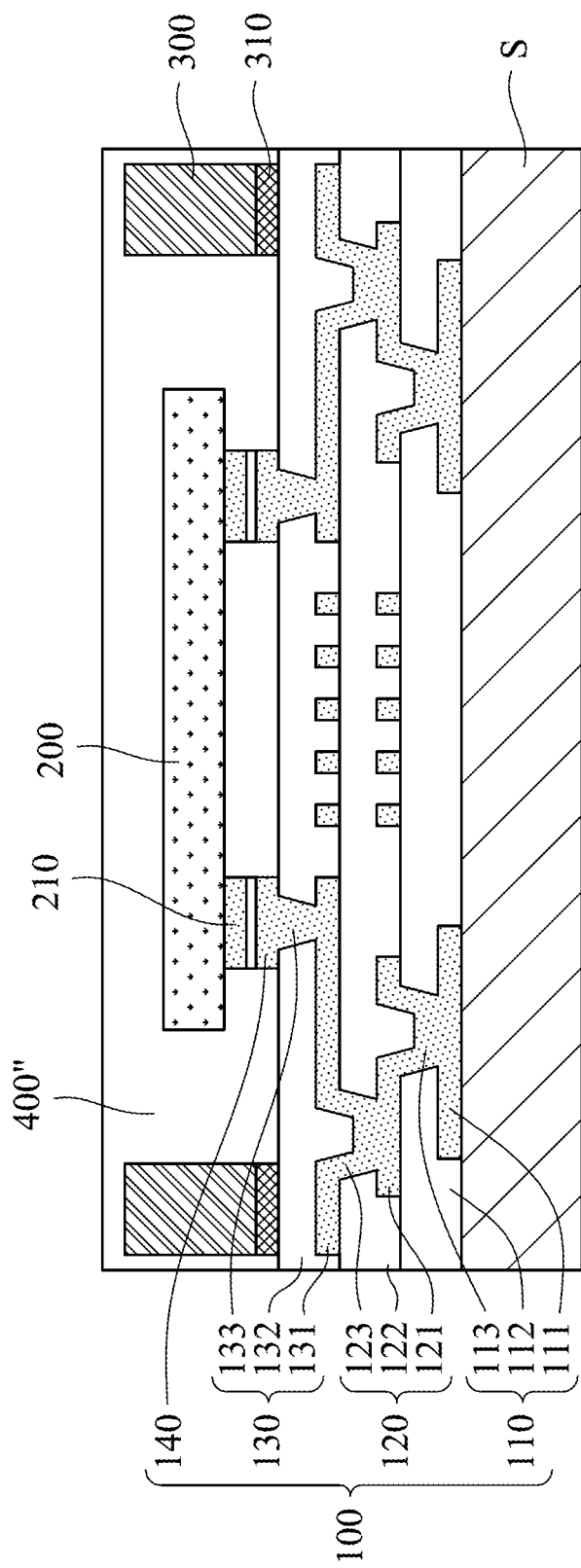

Next, as shown in FIG. 10, a protective layer 400" is formed overlying the chip 200 and the structural reinforcing element 300 and is filled in a gap between the chip 200 and the third redistribution layer 130.

Figure 11:
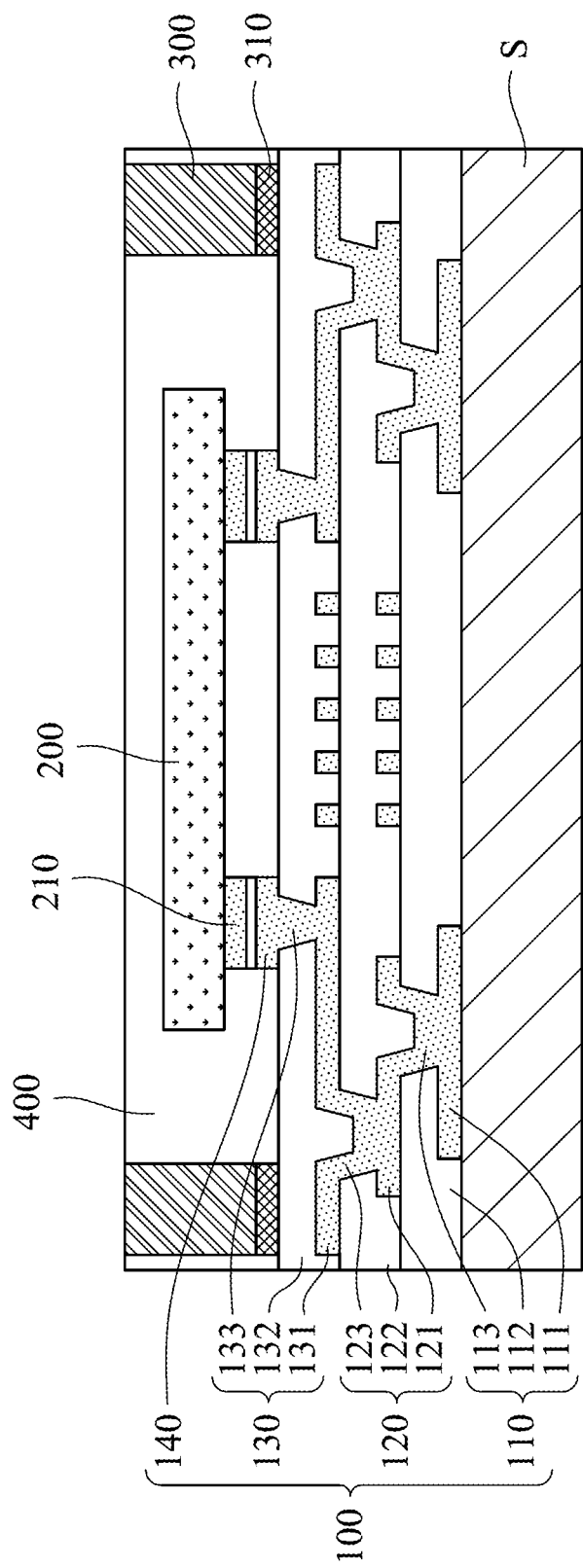

Next, a top portion of the protective layer 400" is removed using a chemical mechanical polishing (CMP) process to form a protective layer 400 exposing an upper surface of the structural reinforcing element 300, as shown in FIG. 11. It should be noted that removing the top portion of the protective layer 400" provides a specific technical effect. Specifically, there is a large difference between the coefficient of thermal expansion of the material of the protective layer 400" and those of other elements, and thus the excessively thick protective layer 400" tends to cause warpage of the package structure. The warpage of the package structure can be improved by removing the top portion of the protective layer 400".

Next, the substrate S is peeled off to expose the first circuit layer 111. Subsequently, solder balls 500 in contact with the first circuit layer 111 are formed, thereby forming the package structure 10 as shown in FIG. 1A.

Figure 12:
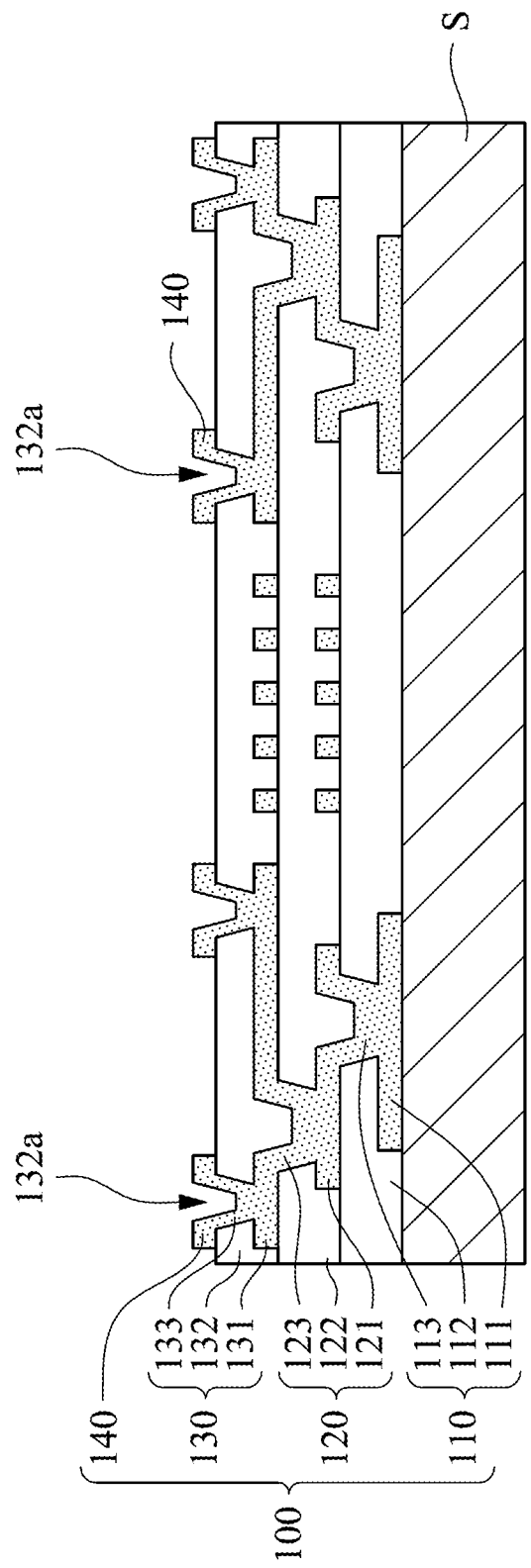
FIGS. 12 to 17 are cross-sectional views of various stages of a method of manufacturing a package structure according to the second embodiment of the present disclosure.

FIGS. 12 to 17 are cross-sectional views of various stages of a method of manufacturing a package structure 10a according to the second embodiment of the present disclosure. FIG. 12 is continued from FIG. 6, and a third insulating layer 132 is formed covering the third circuit layer 131, and the third insulating layer 132 includes a via hole 132a exposing a portion of the third circuit layer 131. For example, a dielectric material is formed over the third circuit layer 131, and the dielectric material is patterned to form the via hole 132a.

Next, a conductive pad 140 is formed over the third insulating layer 132, and a third conductive contact 133 is formed in the via hole 132a. For example, a conductive material is formed over the third insulating layer 132 and is formed in the via hole 132a. Next, the conductive material is patterned to form the conductive pad 140 and the third conductive contact 133. Thereby, a redistribution structure 100 is formed over the substrate S.

Figure 13:
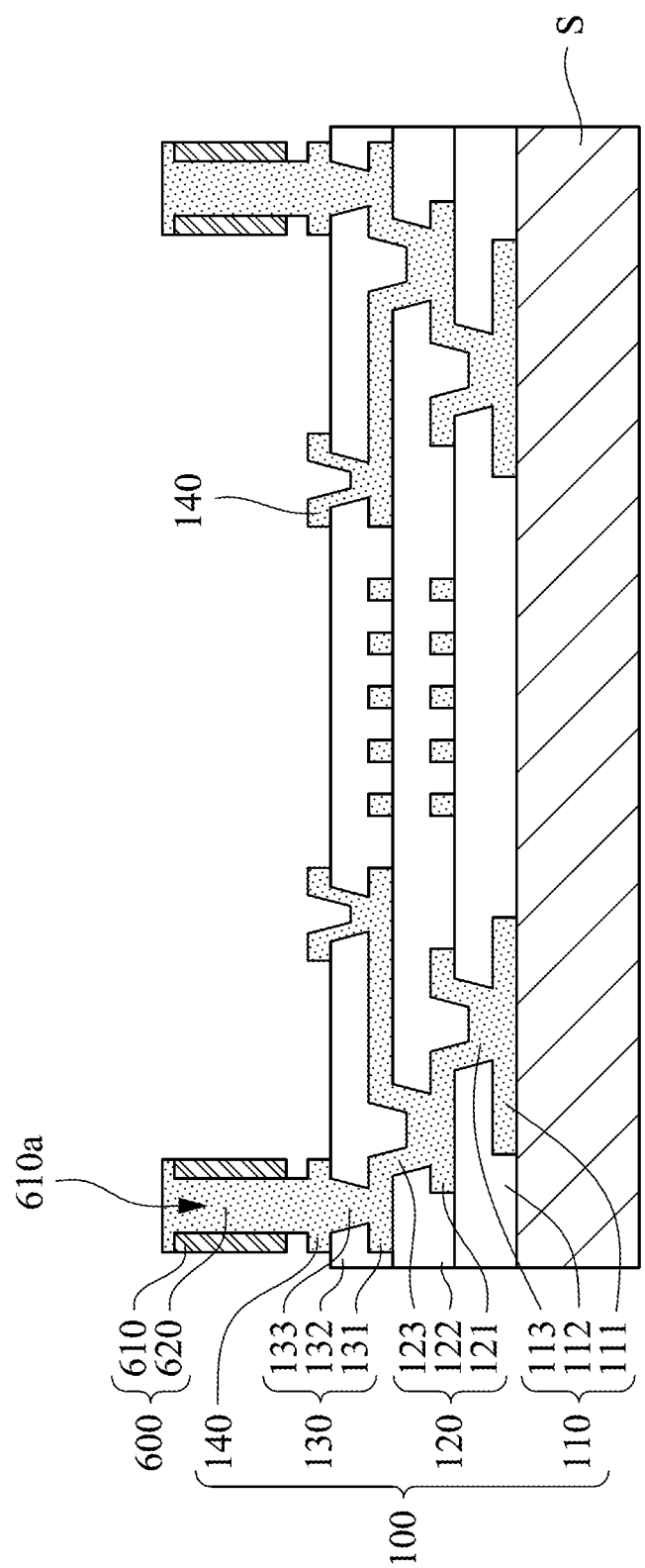

Next, as shown in FIG. 13, an inner conductive reinforcing element 600 is formed over the redistribution structure 100. For example, a conductive connector 620 of the inner conductive reinforcing element 600 is bonded to the conductive pad 140 using a bonding process. It is worth mentioning that the conductive pad 140 has a recess (as shown in FIG. 12) to provide a specific technical effect. Specifically, when bonding the conductive connector 620 with the conductive pad 140, a bottom portion of the conductive connector 620 may press an inclined surface of the recess of the conductive pad 140, thereby generating a driving force, so that a diffusion rate of copper atoms of the conductive connector 620 and the conductive pad 140 (when both the conductive connector 620 and the conductive pad 140 are made of copper) can be effectively increased. Therefore, temperature and pressure required for the bonding process of the conductive connector 620 and the conductive pad 140 can be effectively reduced. At the same time, the overall structural stability can be effectively increased because it does not need to withstand high temperature and high pressure. With regard to advantages of the conductive pad 140 having the recess, such as reducing the temperature and pressure required for the bonding process, as well as improving the structural stability, etc., those may be referred to U.S. patent application Ser. No. 15/590,020 (all are incorporated herein by reference) and are not be described here.

Figure 19:
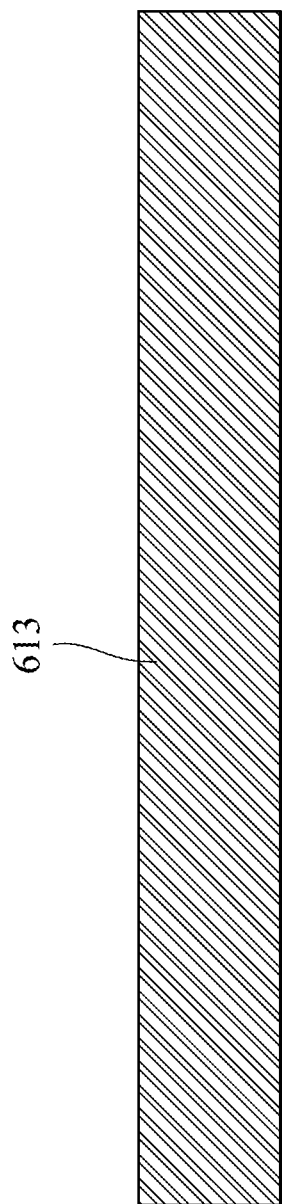
FIGS. 19 to 22 are cross-sectional views of various stages of a method of manufacturing an inner conductive reinforcing element according to an embodiment of the present disclosure.
Figure 20:
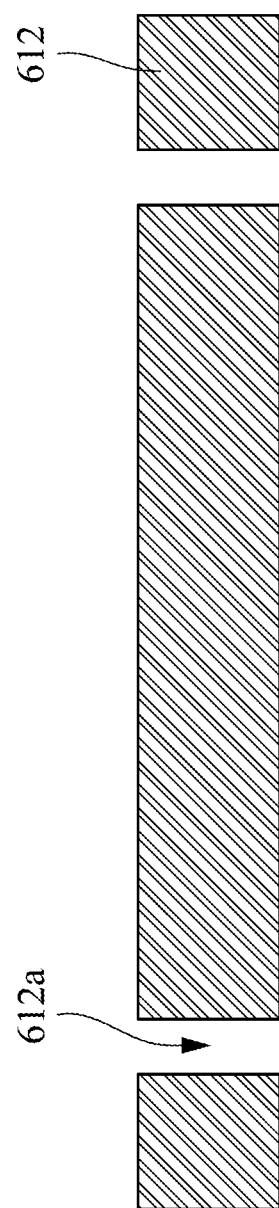
Figure 21:
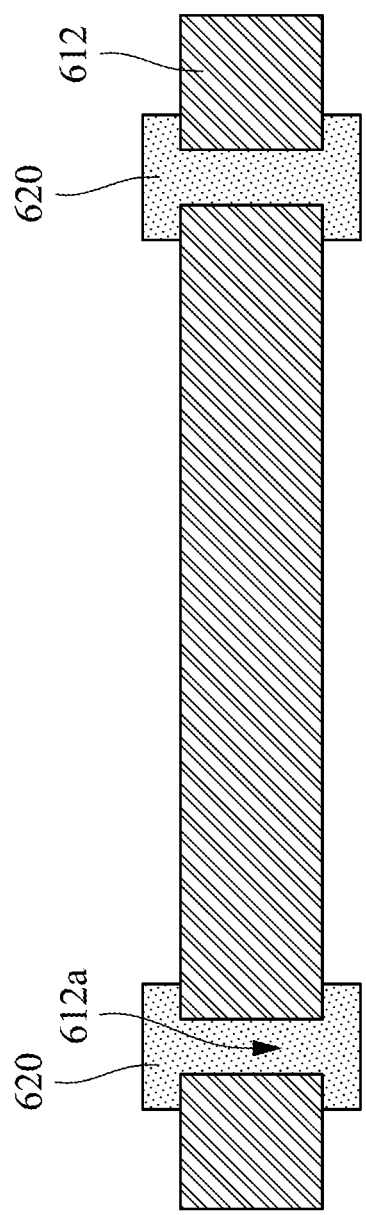
Figure 22:
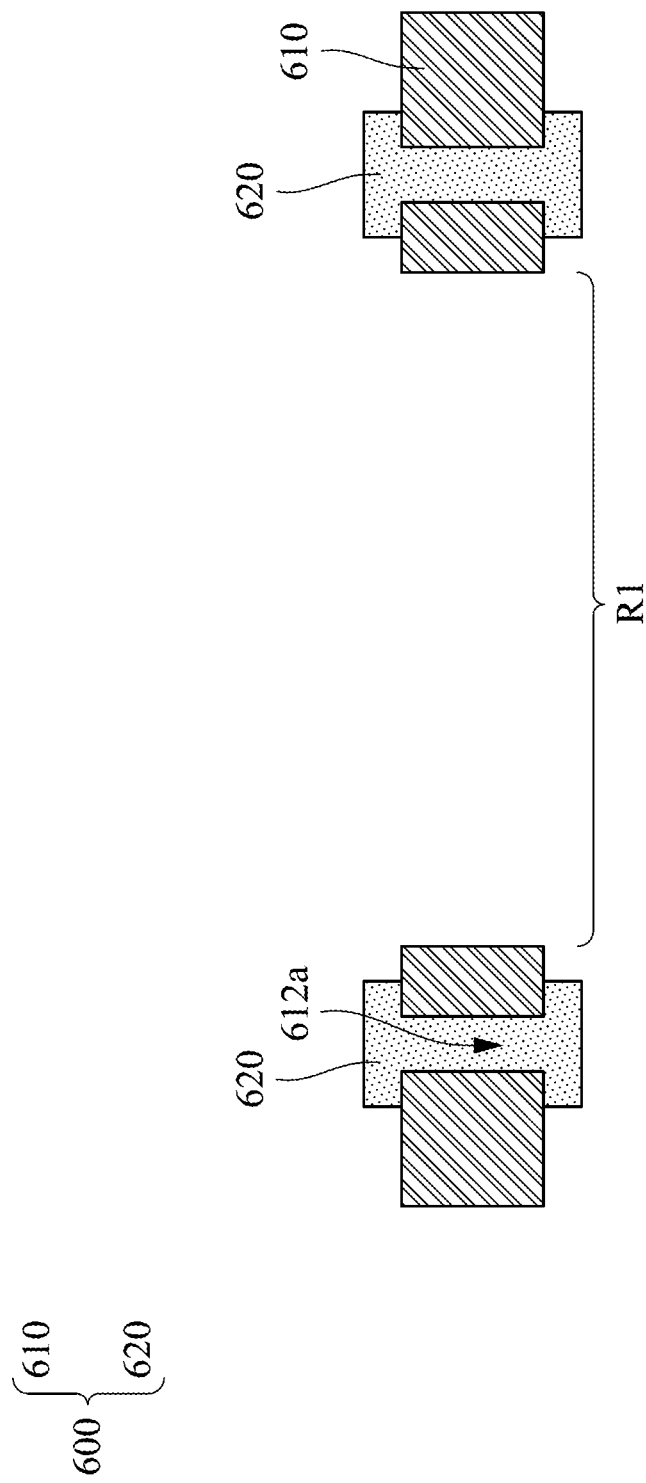

A method of manufacturing an inner conductive reinforcing element 600 is also provided herein. Referring to FIGS. 19 to 22, FIGS. 19 to 22 are cross-sectional views of various stages of a method of manufacturing an inner conductive reinforcing element 600 according to an embodiment of the present disclosure. As shown in FIG. 19, a substrate 613 is firstly provided, in which the substrate 613 has a Young's modulus in a range of 30 to 200 GPa. Next, as shown in FIG. 20, a drilling process is performed to form a substrate 612 having a through hole 612a. Next, an electroplating process is performed to form a conductive connector 620 in the through hole 612a, as shown in FIG. 21. Subsequently, a removal process (e.g., etching) is performed to remove a portion of substrate 612 located in a region R1 to form the inner conductive reinforcing element 600, as shown in FIG. 22. The region R1 is the position where the chip 200 is disposed during a subsequent operation.

Figure 14:
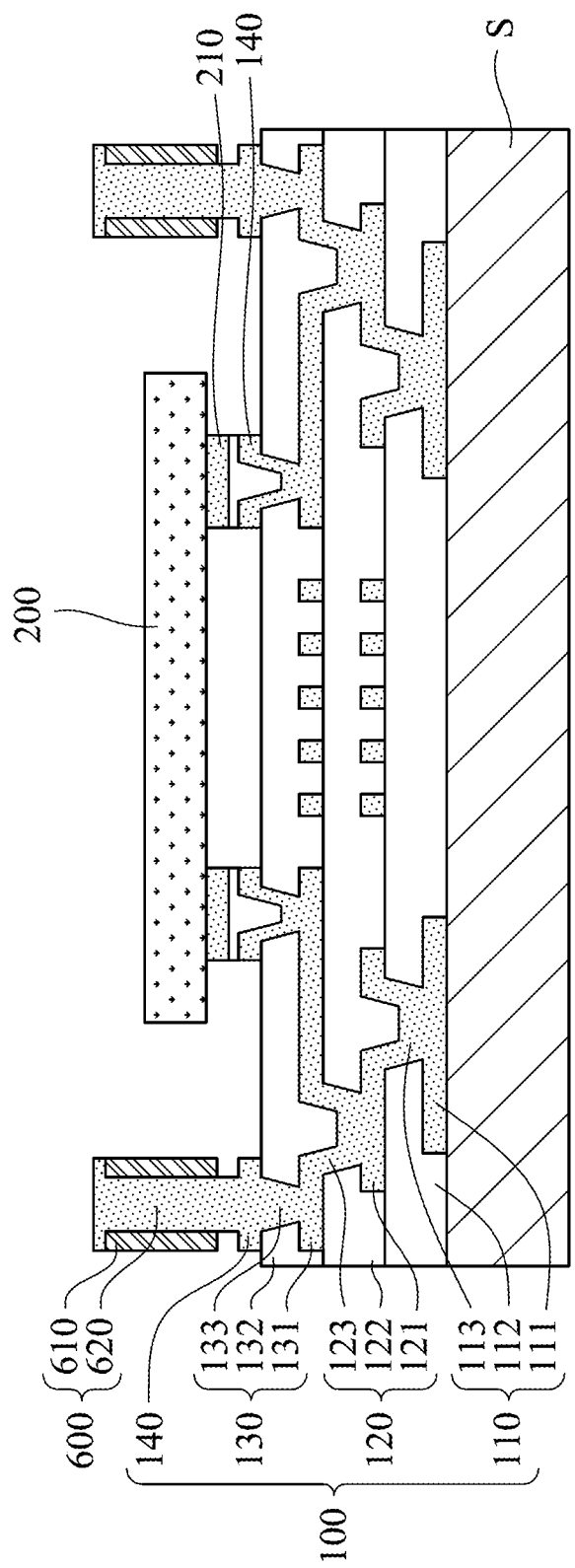

Next, as shown in FIG. 14, a chip 200 is disposed over the redistribution structure 100. For example, a plurality of metal bumps 210 (e.g., chip pins) on a lower surface of the chip 200 are bonded to the conductive pads 140 using a solder material.

Figure 15:
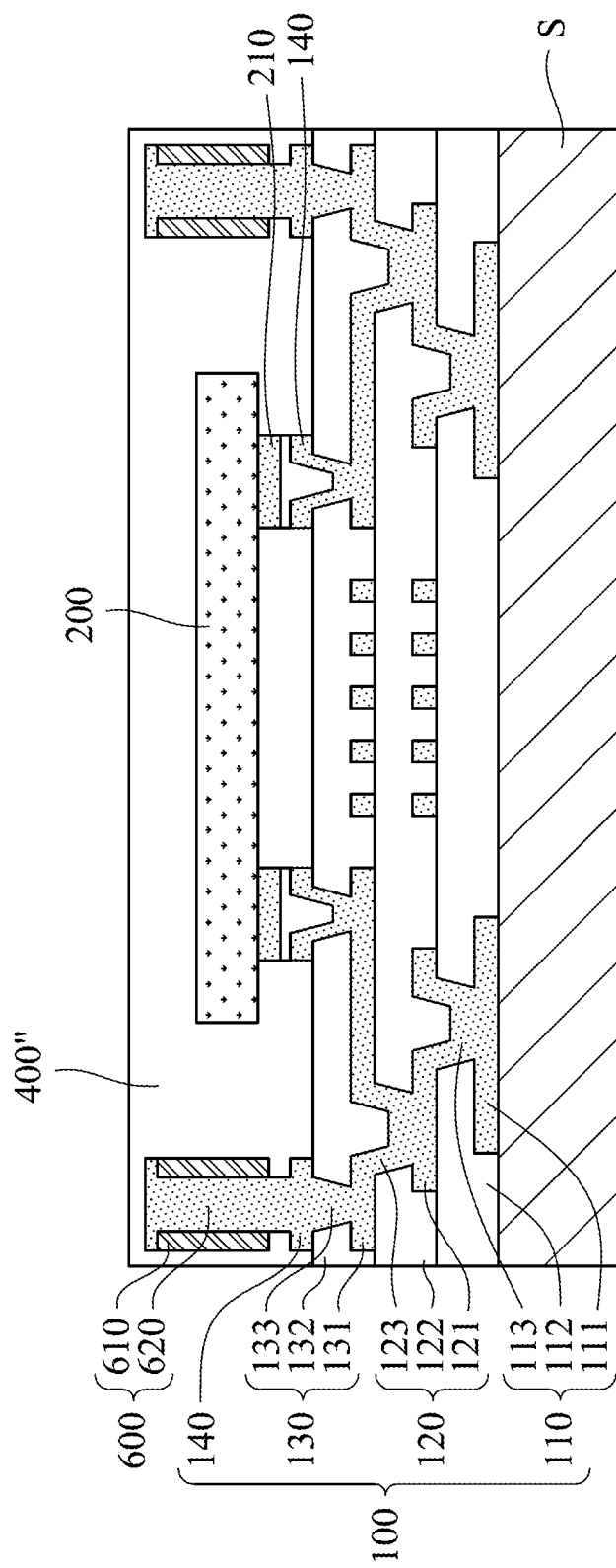

Next, as shown in FIG. 15, a protective layer 400" is formed overlying the chip 200 and the inner conductive reinforcing element 600, and is filled in a gap between the chip 200 and the third redistribution layer 130.

Figure 16:
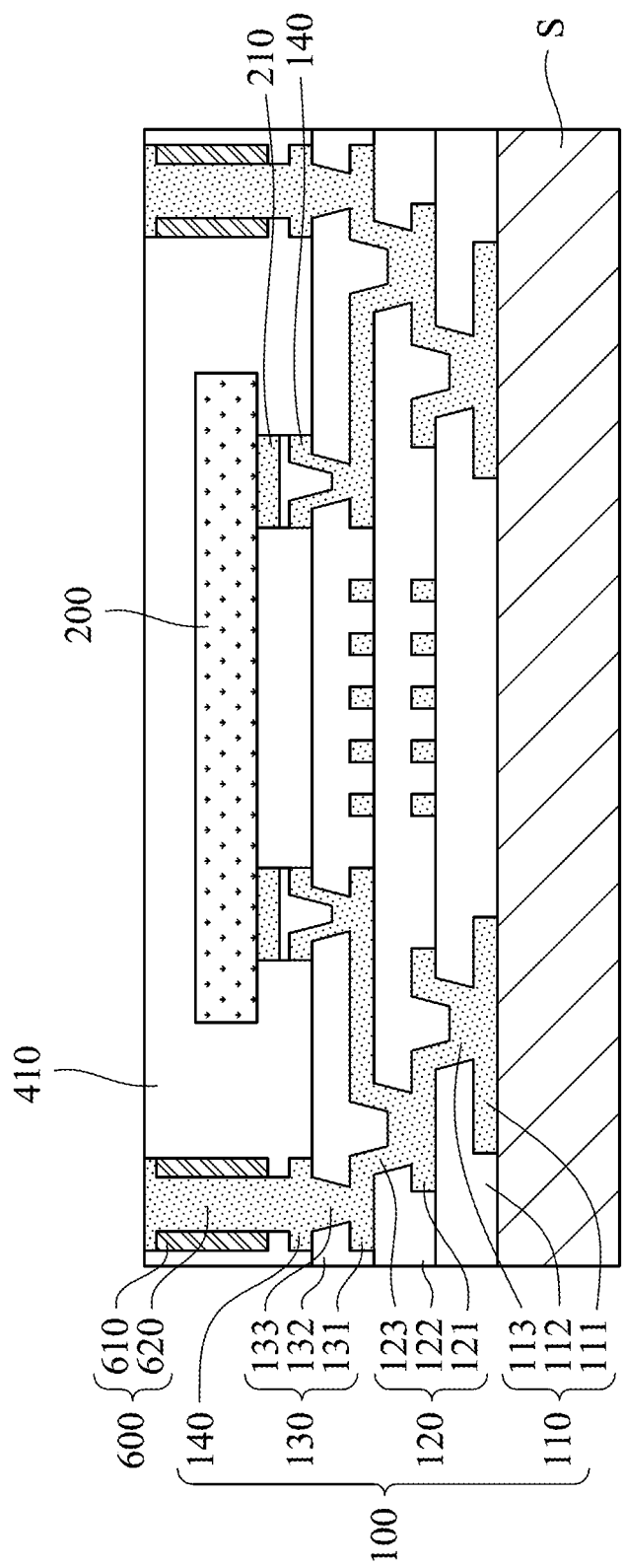

Next, a top portion of the protective layer 400" is removed using a chemical mechanical polishing process to form a first protective layer 410 exposing an upper surface of the inner conductive reinforcing element 600 as shown in FIG. 16. As described above, the warpage of the package structure can be improved by removing the top portion of the protective layer 400".

Figure 17:
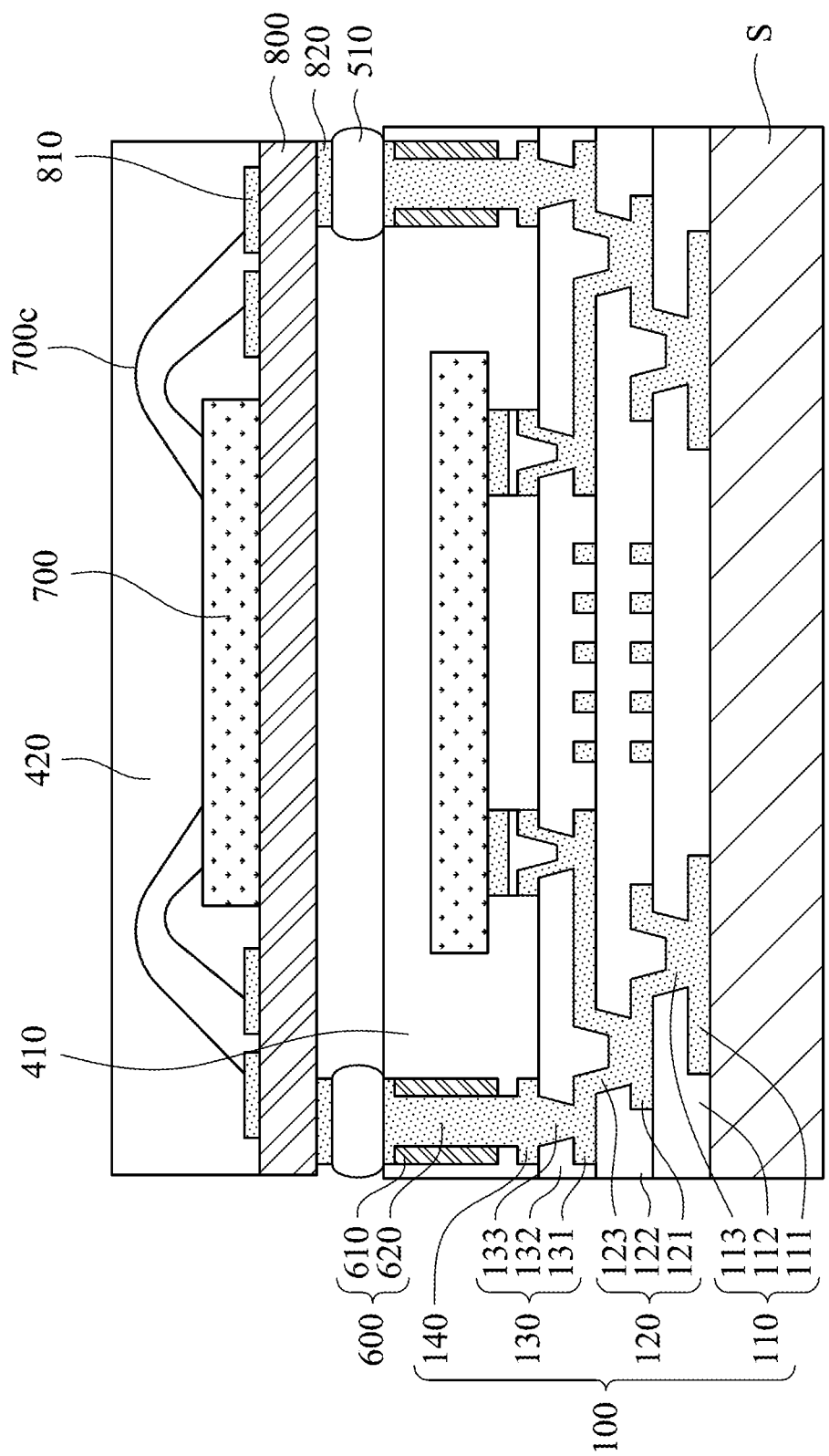

Next, as shown in FIG. 17, an electronic component 700 is disposed over the first protective layer 410, and the electronic component 700 is electrically connected to the top portion of the conductive connector 620. Specifically, a second conductive pad 820 is bonded to the top portion of the conductive connector 620 using a solder material 510. The electronic component 700 is electrically connected to the first conductive pad 810 through a wire 700c, and the first conductive pad 810 is electrically connected to the second conductive pad 820 through an inner circuit. Therefore, the electronic component 700 is electrically connected to the top portion of the conductive connector 620.

Next, the substrate S is peeled off to expose the first circuit layer 111. Subsequently, solder balls 500 in contact with the first circuit layer 111 are formed, thereby forming the package structure 10a as shown in FIG. 2.

Figure 18:
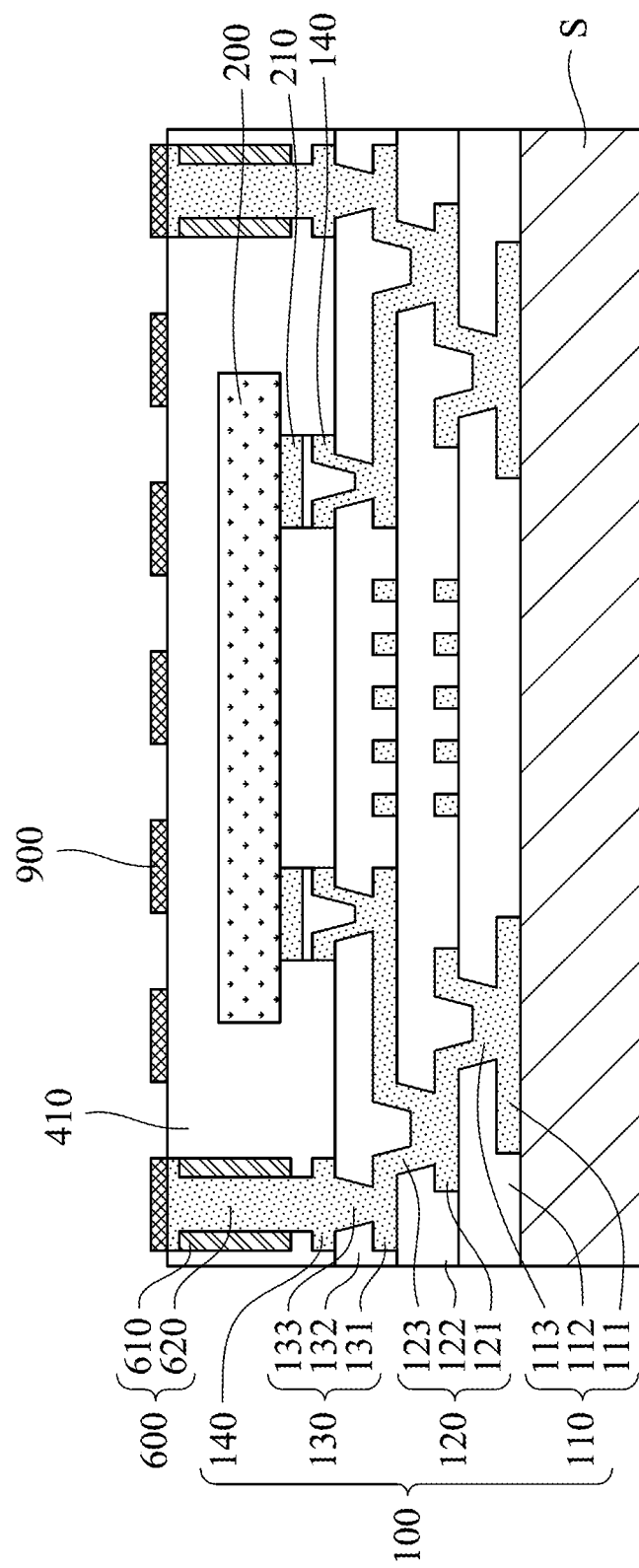
FIG. 18 is a cross-sectional view of a stage of a method of manufacturing a package structure according to a third embodiment of the present disclosure.

FIG. 18 is a cross-sectional view of a stage of a method of manufacturing a package structure 10b according to a third embodiment of the present disclosure. FIG. 18 is continued from FIG. 16, and an antenna pattern 900 is formed over the first protective layer 410 such that the antenna pattern is in contact with and electrically connects the top portion of the conductive connector 620.

Next, the substrate S is peeled off to expose the first circuit layer 111. Subsequently, solder balls 500 in contact with the first circuit layer 111 are formed, thereby forming the package structure 10b as shown in FIG. 3.

It can be seen from the above embodiments of the present disclosure that the package structure disclosed herein has a sufficient mechanical strength. Therefore, even if there is a large difference between coefficients of thermal expansion of materials of elements of the package structure, the warpage is less likely to occur. In addition, since the package structure is less prone to warpage, it is suitable to directly form a flat antenna pattern over the package structure. Alternatively, another package structure is disposed over the package structure to form a package-on-package.

While the present disclosure has been disclosed above in the embodiments, other embodiments are possible. Therefore, the spirit and scope of the claims are not limited to the description contained in the embodiments herein.

It is apparent to those skilled in the art that various alternations and modifications may be made without departing from the spirit and scope of the present disclosure, and the scope of the present disclosure is defined by the scope of the appended claims.

What is claimed is:

1. A package structure, comprising:
   a redistribution structure comprising a first circuit layer and a second circuit layer disposed over the first circuit layer, wherein the first circuit layer is electrically connected to the second circuit layer;
   a chip disposed over the redistribution structure and electrically connected to the second circuit layer;
   one or more structural reinforcing elements disposed over the redistribution structure, wherein the structural reinforcing element has a Young's modulus of 30 to 200 GPa; and
   a protective layer overlying an upper surface and sidewalls of the chip and sidewalls of the one or more structural reinforcing elements, wherein an upper surface of the one or more structrual reinforcing elements and an upper surface of the protective layer are coplanar and higher than the upper surface of the chip.

2. The package structure of claim 1, wherein the package structure comprises one structural reinforcing element, and the structural reinforcing element surrounds the chip.

3. The package structure of claim 1, wherein the package structure comprises a plurality of structural reinforcing elements, and one of the structural reinforcing elements is disposed at a first side of the chip, and another of the structural reinforcing elements is disposed at a second side of the chip, and the second side is opposite or adjacent to the first side.

4. The package structure of claim 1, wherein the structural reinforcing element and the chip are separated by a horizontal distance in a range of 50 to 1000 μm.

5. The package structure of claim 1, wherein a material of the structural reinforcing element comprises bismaleimide-triazine resin, epoxy resin, tin paste or copper paste.

6. A method of manufacturing a package structure, comprising:

(i) providing a redistribution structure, wherein the redistribution structure comprises a first circuit layer and a second circuit layer disposed over the first circuit layer, and the first circuit layer is electrically connected to the second circuit layer;

(ii) forming one or more structural reinforcing elements over the redistribution structure, wherein the structural reinforcing element has a Young's modulus in a range of 30 to 200 GPa;

(iii) disposing a chip over the redistribution structure, wherein the chip is electrically connected to the second circuit layer; and (iv) forming a protective layer overlying an upper surface and sidewalls of the chip and sidewalls of the one or more structural reinforcing elements, wherein an upper surface of the one or more structural reinforcing elements and an upper surface of the protective layer are coplanar and higher than the upper surface of the chip.

7. The method of manufacturing the package structure of claim 6, after the operation (iv), further comprising:

(v) removing a top portion of the protective layer to expose an upper surface of the structural reinforcing element.

8. The package structure of claim 1, wherein a material of the structural reinforcing element comprises bismaleimide-triazine resin, tin paste or copper paste.

* * * * *